US006456138B1

(12) United States Patent
Yoder et al.

(10) Patent No.: US 6,456,138 B1
(45) Date of Patent: Sep. 24, 2002

(54) METHOD AND APPARATUS FOR A SINGLE UPSET (SEU) TOLERANT CLOCK SPLITTER

(75) Inventors: Joseph W. Yoder, Oakton; Abbas Kazemzader, Herndon, both of VA (US)

(73) Assignee: BAE Systems Information and Electronic Systems Integration, Inc., Nashua, NH (US)

( * ) Notice: Subject to any disclaimer, the term of this patent is extended or adjusted under 35 U.S.C. 154(b) by 0 days.

(21) Appl. No.: 09/559,659

(22) Filed: Apr. 28, 2000

Related U.S. Application Data

(60) Provisional application No. 60/131,925, filed on Apr. 30, 1999.

(51) Int. Cl.[7] .............................. G06F 1/04; H03K 3/00
(52) U.S. Cl. ...................... 327/293; 327/295; 327/256; 327/239
(58) Field of Search ................................ 327/239, 243, 327/245, 251, 253, 254, 256, 257, 291, 293, 295

(56) References Cited

U.S. PATENT DOCUMENTS

| | | | | |
|---|---|---|---|---|
| 3,961,269 A | * | 6/1976 | Alvarez, Jr. ................. | 327/239 |
| 4,686,677 A | | 8/1987 | Flora ........................... | 371/61 |
| 4,827,157 A | * | 5/1989 | Machida et al. ............ | 327/259 |
| 5,418,473 A | | 5/1995 | Canaris ....................... | 326/27 |
| 5,440,260 A | * | 8/1995 | Hayashi et al. ............. | 327/278 |
| 5,784,386 A | | 7/1998 | Norris .......................... | 371/36 |
| 5,870,332 A | | 2/1999 | Lahey et al. ................ | 365/156 |

OTHER PUBLICATIONS

Okabe, et al, "Design for Reducing Alpha–Particle–Induced Soft Errors in ECL Logic Circuitry," IEEE Journal of Solid–State Circuits, No. 5, pp. 1397–1403, Oct. 1989.
"LSSD Compatible Non–Overlapping Clock Spitter," IBM Technical Disclosure Bulletin, vol. 31, No. 4, pp. 67–70, Sep. 1988.

* cited by examiner

Primary Examiner—Terry D. Cunningham
Assistant Examiner—Quan Tra
(74) Attorney, Agent, or Firm—Swidler Berlin Shereff Friedman, LLP

(57) ABSTRACT

A clock splitter circuit for providing a single event upset (SEU) tolerant clock signal to latches in a space-based environment. The clock splitter circuit can include one or more event offset circuit delay circuits. The event offset delay receives a clock signal and generates a delayed clock signal. The event offset delay circuit can generate an inverted clock signal, a delayed inverted clock signal and a pair of intermediate clock signals. The delayed clock signal and inverted delayed clock signal can be delayed by the known duration of single event effects (SEE). The delayed and undelayed clock signals can be passed to an event blocking filter which can block any disturbance in the delayed and/or undelayed clock signals. A synchronizer can synchronize outputs of the event blocking filter prior to or coincident with being passed to corresponding inverting clock drivers. The synchronizers can also insure that the synchronized blocking filter outputs can not be low simultaneously. Intermediate clocks can also be provided corresponding to the inverting clock drivers. Outputs of the inverting clock driver can be a pair of SEU tolerant non-overlapping clock phase signals for driving one or more latches.

19 Claims, 12 Drawing Sheets

METHOD AND APPARATUS FOR A SINGLE UPSET (SEU) TOLERANT CLOCK SPLITTER

This application claims the benefit of Provisional application Ser. No. 60/131,925, filed Apr. 30, 1999.

RELATED APPLICATIONS

The present invention is related to U.S. patent application Ser. No. 09/559,660 entitled "Method and Apparatus for a Scannable Hybrid Flip Flop" to Hoffmnan et al. and related to U.S. patent application Ser. No. 09/559,661 entitled "Method and Apparatus for a SEU Tolerant Clock Splitter" to Hoffman, both filed coincident herewith and of common assignee to the present application, the contents of which are incorporated herein by reference in their entireties.

BACKGROUND OF THE INVENTION

1. Field of the Invention

The present invention is related to radiation hardened integrated circuits and, more particularly, to clock generation circuits for radiation hardened integrated circuits.

2. Related Art

Increasingly, space-based communication systems are including integrated circuits (IC) made in advanced deep sub-micron Field Effect Transistor (FET) technology. Typically, these ICs are in the insulated gate silicon technology commonly referred to as complementary metal oxide semiconductor (CMOS). CMOS ICs are advantageous in that they are high speed and low power. The CMOS ICs use little power compared to what other technologies require for comparable speed and function.

In a space-based environment, however, ionic strikes by sub-atomic cosmic particles are known to introduce circuit disturbances. These circuit disturbances are known as single event effects (SEE) and, as single event upsets (SEU) when corrupting data in storage elements. Radiation hardened latches are well known and are used, effectively, to reduce or to eliminate SEU in space-based IC registers, latches and other storage elements. These radiation hardened storage elements are designed to protect from disturbance what is stored in them in spite of any cosmic particle hits that the storage elements might sustain.

However, over time, as circuit performance has increased, the propagation delay through the logic between the radiation hardened latches or registers has been reduced to within an order of magnitude of the duration of an SEE. For example, a pipelined logic chip operating at 200 MHz can have 3–3.5 nanoseconds allocated for logic propagation delays between registers. A single event upset occurring in the logic can cause an invalid result for 0.5–1.0 nanoseconds because this is a significant amount of time with respect to a pulse width. Such an event occurring in a clock distribution chain causes a more widespread and potentially a much more serious result.

Typically, chip clocks are received by a receiver connected to a bonding pad of the IC. The receiver buffers and redrives the clock, typically, to multiple locations on the chip. At each of these locations, the clock is again buffered and redriven. This rebuffered clock can further distributed to multiple locations, where it can again be rebuffered and redriven. The clock distribution can be represented as a tree spreading out from the original receiver.

The effects from an event occurring in a clock tree can cause a transient in the clock signal on part of the clock tree of approximately 0.5 nanoseconds, which can appear as a false clock pulse. Further, the number of latches and registers affected by the false clock pulse is random and depends on where in the tree the event occurs. Such a false clock pulse can clock registers causing the registers to latch invalid data. The invalid latched data can be passed from the initial registers through the next logic stage. This can result in multiple uncorrectable multi-bit logic errors.

The severity of this problem only increases with greater levels of very large scale integration (VLSI) circuit integration because these higher levels of integration achieve higher performance through smaller features. For example, with circuits operating in the 1 GHz clock range, a single event could wipe out an entire clock cycle for the affected part of the IC logic. Thus, it can be seen that clock tree SEE immunity is critical to preventing logic errors.

For example, FIG. 1 illustrates a typical state of the art scan d-flip-flop (scan dff) 100. The scan d flip-flop 100 includes a 2:1 multiplexer 102, which is coupled to a first level sensitive latch 104. The first level sensitive latch 104 is coupled to a second level sensitive latch 106. The scan dff 100 is clocked by a clock signal 107. The clock signal 107 is split into complementary signals by inverting clock signal 107 with inverter 108. The complementary clock signals are provided to first level sensitive latch 104 and second level sensitive latch 106, gating first and second pairs of pass gates 110, 112 and 114, 116, respectively.

When selected, an input DATAIN 118 passes through the 2:1 multiplexer 102 to the first pair of pass gates 110, 112 as complementary outputs 120, 122 of multiplexer 102. When the clock signal 107 is low, pass gates 110, 112, are turned on so that data and complementary outputs 120, 122 are passed to first level sensitive latch 104 and, tentatively, are stored therein. With the clock signal 107 low, the second pair of pass gates 114, 116 are contemporaneously turned off, and isolate the second level sensitive latch 106 from outputs 124, 126 of the first level sensitive latch 104.

The rising edge of clock signal 107 turns on the second pair of pass gates 114, 116 as the output of inverter 108 falls, simultaneously, to turn off the first pair of pass gates 110, 112. When the first pair of pass gates 110, 112 are turned off, the complementary outputs 120, 122 are isolated from the first level sensitive latch 104 and, so, data is latched in the first level sensitive 101 latch 104. When the second pair of pass gates 114, 116 are turned on, outputs 124, 126 of the first level sensitive latch 104 are passed to the second level sensitive latch 106. The state of outputs 124, 126, is stored, tentatively, in the second level sensitive latch 106 and, simultaneously, is passed out on an output DATAOUT 128. When clock signal 107 falls, on the next clock cycle, the second pair of pass gates 114, 116 are turned off, isolating the second level sensitive latch 106 from the outputs 104, 126 of first level sensitive latch 104, latching data in the second level sensitive latch 106 to complete the clock cycle.

Normally, when the clock signal 107 is well behaved with regularly spaced high and low periods, it is sufficient that data provided to the input DATAIN 118 meet setup (i.e., be valid for a specified period prior to the rise of clock signal 107) and hold (i.e., remain valid for a specified period after the rise of clock signal 107) timing requirements. At any time, other than this window around clock signal 107 rising, the state of input DATAIN 118 is specified as a "don't care" condition.

Unfortunately, an upsetting event occurring in the clock tree prior to clock signal 107 can cause a false clock pulse on clock signal 107. Since input DATAIN 118 is specified as a "don't care," a falling edge of a false clock pulse on clock signal 107 could cause the first level sensitive latch 104 to switch states, inadvertently storing data. Further, when the input clock returns high, that invalid level can be passed to the second level sensitive latch 106 and out of the scan dff 100 on output DATAOUT 128. The false clock pulse is a pulse perturbated by an SEE.

Thus, for reasons stated above, and for other reasons stated below, which will become apparent to those skilled in the relevant art upon reading and understanding the present specification, what is needed are clock generation circuits with reduced SEE sensitivity.

SUMMARY OF THE INVENTION

The above mentioned problems with clock generation circuits and radiation hardened storage elements and other problems are addressed by the present invention and which will be understood by reading and studying the following specification.

In one embodiment of the present invention, a clock splitter circuit includes an event offset delay circuit, a first event blocking filter having inputs coupled to a delayed output and an undelayed output of the event offset delay circuit, and a second event blocking filter having inputs coupled to an inverted delayed output signal and an inverted undelayed output signal of the event offset delay circuit wherein the first event blocking filter has an output coupled to an input of the second event blocking filter and the second event blocking filter has an output coupled to an input of the first event blocking filter, a first clock driver having an input coupled to the output of the first event blocking filter and a second clock driver having an input coupled to the output of the second event blocking filter, and wherein the second clock driver has an input coupled to an intermediate output signal and the first clock driver has an input coupled to an inverted intermediate output signal of the event offset delay circuit for synchronization.

In one embodiment of the present invention, the event offset delay circuit can include first, second, third, fourth and fifth inverters coupled in series, where an input to the first inverter is the undelayed output signal and an output of the first inverter is the inverted undelayed output signal, where an input of the third inverter is the intermediate output signal, where an output of the third inverter is the inverted intermediate output signal, where an output of the fourth inverter is the delayed output signal, where an output of the fifth inverter is the inverted delayed output signal, where the undelayed output signal and the delayed output signal are coupled to the input of the first event blocking filter, and where the inverted undelayed output signal and the inverted delayed output signal are coupled to the input of the second event blocking filter.

In one embodiment of the present invention, the first event blocking filter includes three series coupled PFETs, a PFET coupled in parallel with a first and a second of the three series coupled PFETs, and four series coupled NFETs, a drain-source region of one of the four series coupled NFETs being coupled at a first in-phase output of the first event blocking filter to a drain-source region of a third of the series coupled PFETs, the source-drain region of the third one of the series coupled PFETs being a second in-phase output of the first event blocking filter.

In one embodiment of the present invention, a first of the three series coupled PFETs is gated by the delayed output signal and a second of the three series coupled PFETs is gated by the undelayed output signal.

In one embodiment of the present invention, a first of the four series coupled NFETs is gated by the undelayed output signal and a second of the four series coupled NFETs is gated to the delayed output signal, and the third NFET of the four series coupled NFETs is coupled to the output of the second event blocking filter.

In one embodiment of the present invention, a gate of the third of the three series coupled PFETs is coupled to ground.

In one embodiment of the present invention, the parallel coupled PFET is gated to an enable signal of the first event blocking filter.

In one embodiment of the present invention, the fourth NFET of the four series coupled NFETs is gated to the enable signal.

In one embodiment of the present invention, each of the first and the second clock drivers is an inverting clock driver and wherein the first clock driver includes, a first PFET having a source-drain region coupled to a supply voltage, and a gate of the first PFET gated by the first in-phase output of the first event blocking filter, a second PFET having a source-drain region coupled to a drain-source region of the first PFET, and a gate of the second PFET gated by an inverted intermediate output signal, and an NFET having a source-drain region coupled to ground, a gate of the NFET gated by the second in-phase output of the first event blocking filter, and a drain-source region of the NFET coupled to a drain-source region of the second PFET and a drain-source region of the NFET at an output of the first clock driver.

In another embodiment of the present invention, a clock splitter circuit is disclosed including a first event offset delay circuit and a second event offset delay circuit, a first event blocking filter having an input coupled to an input of the first event offset delay circuit, and having another input coupled to an output of the first event offset delay circuit, a second event blocking filter having an input coupled to an input of the second event offset delay circuit, and having another input coupled to an output of the second event offset delay circuit, a first synchronizer having an input coupled to an output of the first event blocking filter, and having another input coupled by a first pair of series coupled inverters to the output of the second event offset delay circuit, a second synchronizer having an input coupled to an output of the second event blocking filter, and having another input coupled by a second pair of series coupled inverters to the output of the first event offset delay circuit, a first clock driver having an input coupled to an output of the first synchronizer, and having another input coupled to an output of the second pair of series coupled inverters, and a second clock driver having an input coupled to an output of the second synchronizer, and having another input coupled to an output of the first pair of series coupled inverters.

In one embodiment of the present invention, the circuit further includes a first NOR gate and a second NOR gate receiving a clock signal and selectively providing the clock signal to one of the first and the second event offset delay circuits.

In one embodiment of the present invention, each of the first and the second event offset delay circuits includes three or more series coupled inverters.

In one embodiment of the present invention, the circuit further includes an inverter receiving an output of the first NOR gate and driving the input of the first event offset delay circuit from an output of the inverter, and a third pair of series coupled inverters receiving an output of the second NOR gate and driving the input of the second event offset delay circuit from an output of the third pair of series coupled inverters.

In one embodiment of the present invention, each of the first and the second event blocking filter includes two series coupled PFETs, and two series coupled NFETs, a drain-source region of one of the two series coupled NFETs being coupled at the output of the event blocking filter to the drain-source region of one of the two series coupled PFETs.

In one embodiment of the present invention, each of the first and the second clock drivers is an inverting clock driver and each of the clock drivers includes a PFET, having a source-drain region of the PFET coupled to a supply voltage, and a gate of the PFET gated by the input coupled to the synchronizer output, and an NFET, having a source-drain region of the NFET coupled to ground, a gate of the NFET gated by the output of the second pair of series coupled inverters, and a drain-source region of the PFET coupled to a drain-source region of the NFET at an output of the each of the clock drivers.

In one embodiment of the present invention, each of the first and the second clock drivers is an inverting clock driver and the first clock driver further includes an input coupled to the output of the first event offset delay circuit and the second clock driver further includes an input coupled to the output of the second offset delay circuit and each of the clock drivers includes, a first PFET, having a source-drain region coupled to a supply voltage, and a gate gated by the input coupled to the synchronizer output, a second PFET, having a source-drain region coupled to a drain-source region of the first PFET, and a gate gated by the coupled output of the event offset delay circuit, and an NFET having a source-drain region coupled to ground, a gate coupled to the output of the second pair of series coupled inverters, and a drain-source region coupled at an output of the each of the clock drivers to a drain-source region of the second PFET.

In yet another embodiment of the present invention, a clock splitter circuit for providing an SEU tolerant pair of non-overlapping complementary clocks is disclosed, where the clock splitter circuit includes a pair of cross-coupled clock buffers, each clock buffer including an event blocking filter of one of the pair of clock buffers receiving an undelayed clock signal and a delayed clock signal, the event blocking filter combining the undelayed clock signal with the delayed clock signal and an output of an event blocking filter of another of the pair of clock buffers, and providing at least one output, and a clock driver being driven by the at least one output to provide a clock phase output signal.

In one embodiment of the present invention, the circuit further includes at least one event offset delay circuit providing the delayed clock signal.

In one embodiment of the present invention, the event offset delay circuit includes a series of one or more inverters.

In one embodiment of the present invention, each clock driver is further driven by an intermediate clock signal to provide the clock phase output signal.

In one embodiment of the present invention, at least one event offset delay circuit is one event offset delay circuit and the series of inverters includes a series of 5 inverters providing an undelayed complementary undelayed clock signal pair, a delayed complementary clock signal pair and an intermediate clock signal pair.

In one embodiment of the present invention, the event blocking filter includes three series coupled devices of a first conduction type, four series coupled devices of a second conduction type, a conduction terminal of one of the three series coupled devices being coupled to a conduction terminal of the four series coupled devices, and a device of the first conduction type being coupled in parallel with two of the three series coupled devices.

In one embodiment of the present invention, the event blocking filter provides a pair of in-phase clock outputs, one of the pair of in-phase outputs is at a coupling point of the parallel coupled device and another of the pair of in-phase outputs is at the coupling point of the three series coupled devices with the four series coupled devices.

In one embodiment of the present invention, the devices of the first conduction type are P-type FETs and the devices of the second conduction type are N-type FETs, and the pair of in-phase outputs are separated by one of the three series coupled PFETs with a gate of the one of the three series coupled PFETs coupled to ground.

In one embodiment of the present invention, at least one event offset delay circuit is an event offset delay circuit in each the clock buffer, and wherein the event offset delay receives the undelayed clock signal and provides the delayed clock signal.

In one embodiment of the present invention, the event blocking filter includes two series coupled first conduction type devices coupled between a supply line and an output terminal, and two series coupled second conduction type devices coupled between said output terminal and a reference voltage line.

In one embodiment of the present invention, the first conduction type devices are P-type FETs and the second conduction type devices are N-type FETs.

In another embodiment of the present invention, a clock splitter circuit for providing an SEU tolerant pair of non-overlapping complementary clocks is disclosed, where the clock splitter circuit includes a pair of cross-coupled clock buffers, each clock buffer including event blocking means, of a first of the pair of clock buffers for blocking single event effects in a received clock signal, for combining the received clock signal with a complementary received output of another event blocking means for combining of a second of the pair of clock buffers, and for providing at least one output, and driver means for driving a non-overlapped clock responsive to the at least one output of the event blocking means.

In one embodiment of the present invention, the circuit further includes an event offset delay means for providing a delayed clock responsive to the received clock signal.

In one embodiment of the present invention, the driver means drives the clock further in response to a complementary intermediate clock signal.

In one embodiment of the present invention, a method of clocking an integrated circuit chip is disclosed including generating a first complementary pair of clock signals, generating a second complementary pair of clock signals, generating a first clock signal from an uninverted signal of the first complementary pair of clock signals and an uninverted signal of the second complementary pair of clock signals, generating a second clock signal from an inverted signal of the first complementary pair of clock signals and an inverted signal of the second complementary pair of clock signals, and synchronizing the first clock signal with the second clock signal.

In one embodiment of the present invention, a first latch clock and a second latch clock are non-overlapping clocks, and the method further includes generating the first latch clock from the first clock signal, and generating the second latch clock from the first clock signal, the first and the second latch clocks clocking the integrated circuit.

In one embodiment of the present invention, in the step of generating the first clock, a pair of in-phase clock signals is generated, and in the step of generating the second clock, a second pair of in-phase clock signals is generated.

In another embodiment of the present invention, a clock splitter circuit is disclosed, including a first synchronizer and a second synchronizer, a first clock driver having a first input coupled to an output of the first synchronizer, and a second input coupled to a first input of the second synchronizer, a second clock driver having a first input coupled to an output of the second synchronizer, and a second input coupled to a first input of the first synchronizer, a first inverter and a second inverter coupled in series, coupled at an output of the first inverter to a third input of the first clock driver, and coupled at an output of the second inverter to a second input of the first synchronizer, a third inverter having an input coupled to the output of the second inverter and having an output coupled to the second input of the first clock driver, a fourth inverter having an input coupled to a third input of the second clock driver, and a fifth inverter having an input coupled to an output of the fourth inverter, and having an output coupled to the first input of the second clock driver.

In one embodiment of the present invention, the circuit further includes a first NOR gate having a first clock input and a second clock input, and having an output coupled to the input of the first inverter, and a second NOR gate having a first clock input and a second clock input coupled to the second clock input of the first NOR gate, and having an output coupled to the input of the fourth inverter.

In an embodiment of the present invention, a clock splitter circuit is disclosed for providing a single event upset (SEU) and single event effect (SEE) tolerant clock signal. In one embodiment, the clock signals can be used to clock latches in a space-based environment. The clock splitter circuit can include in one embodiment one or more event offset delay circuits. The event offset delay circuit receives a clock signal and generates a delayed clock signal. The event offset delay circuit can generate an inverted clock signal, a delayed inverted clock signal and a pair of intermediate clock signals. The delayed clock signal and inverted delayed clock can be delayed by the known duration of single event effects (SEE). The delayed and undelayed clock signals can be passed to an event blocking filter which blocks any disturbance in the delayed and/or undelayed clock signal. A synchronizer can synchronize the event blocking filter output signals prior to, or coincident with, being passed to corresponding inverting clock drivers. The synchronizers also can insure that the synchronized blocking filter output signals can not be low simultaneously. Corresponding ones of the intermediate clock signals can also be provided to the inverting clock drivers. The inverting clock driver outputs can be a pair of SEU tolerant nonoverlapping clock phase signals for driving one or more latches.

It is an advantage of the invention that integrated circuit chip SEE sensitivity can be reduced.

It is another advantage of the invention that integrated circuit power can be reduced.

It is yet another advantage of the invention that integrated circuit chip clock tree SEE sensitivity can be reduced.

It is yet another advantage of the invention that timing related SEU sensitivity is reduced on space based integrated circuit chips.

Further features and advantages of the invention, as well as the structure and operation of various embodiments of the invention, are described in detail below with reference to the accompanying drawings. In the drawings, like reference numbers generally indicate identical, functionally similar, and/or structurally similar elements. The drawing in which an element first appears is indicated by the leftmost digits in the corresponding reference number.

BRIEF DESCRIPTION OF THE DRAWINGS

The foregoing and other features and advantages of the invention will be apparent from the following, more particular description of a preferred embodiment of the invention, as illustrated in the accompanying drawings.

DETAILED DESCRIPTION OF AN EXEMPLARY EMBODIMENT OF THE INVENTION

In the following detailed description of illustrative embodiments of the present invention, reference is made to the accompanying drawings which form a part hereof, and in which are shown by way of illustration specific illustrative embodiments in which the invention can be practiced. These embodiments are described in sufficient detail to enable those skilled in the art to practice the invention and it is to be understood that other embodiments can be used and that logical, mechanical and electrical changes can be made without departing from the spirit and scope of the present invention. The following detailed description is, therefore, not to be taken in a limiting sense.

The illustrative embodiments described herein concern electrical circuitry which uses voltage levels to represent binary logic states—namely, a "high" logic level and a "low" logic level. Further, electronic signals used by the various embodiments of the present invention are generally considered active when they are high, however, an asterisk (*) following the signal name in this application indicates that the signal is negative or inverse logic. Negative or inverse logic is considered active when the signal is low.

Figure 1:
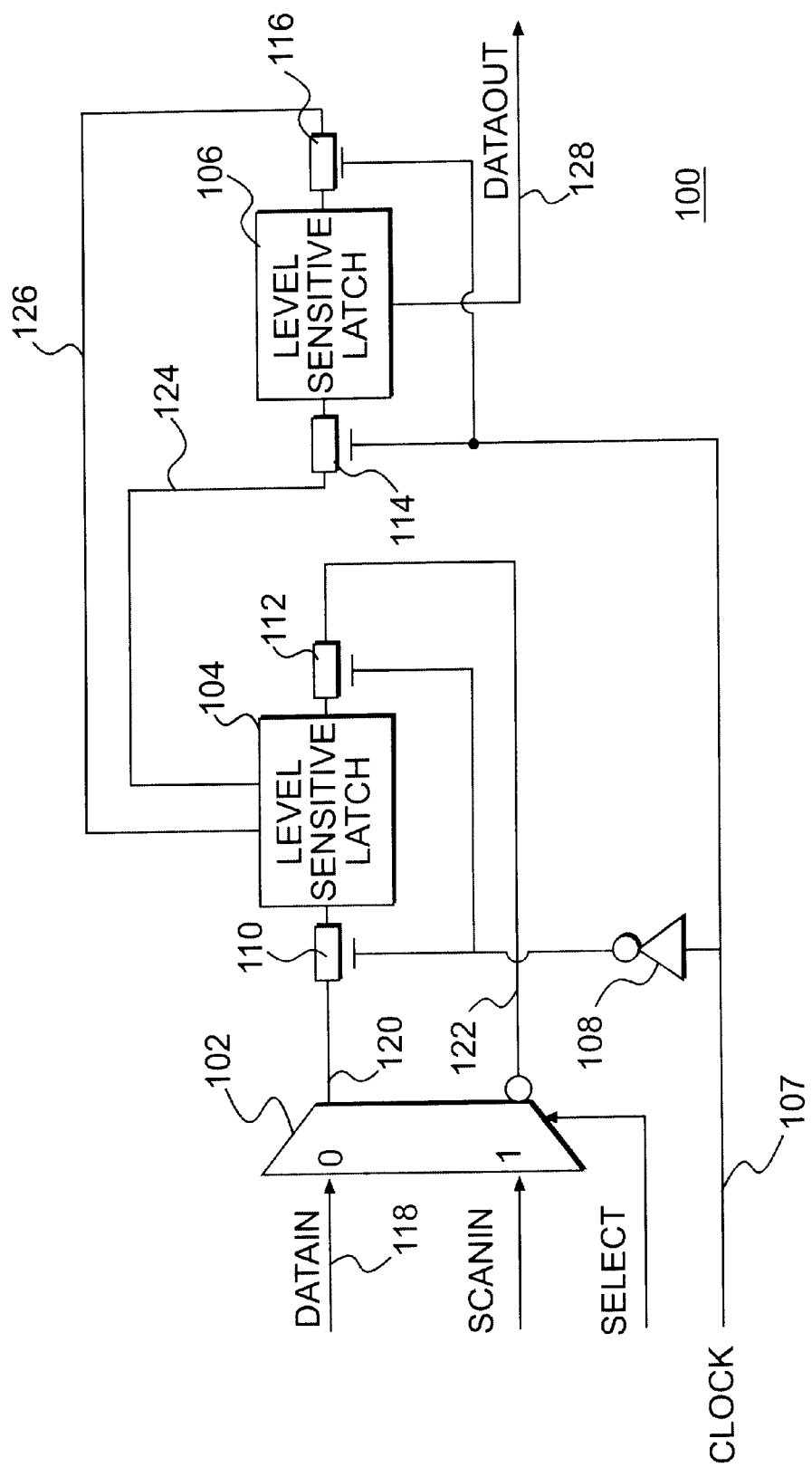
FIG. 1 is an exemplary block diagram of a conventional scan d-flip-flop.
Figure 2:
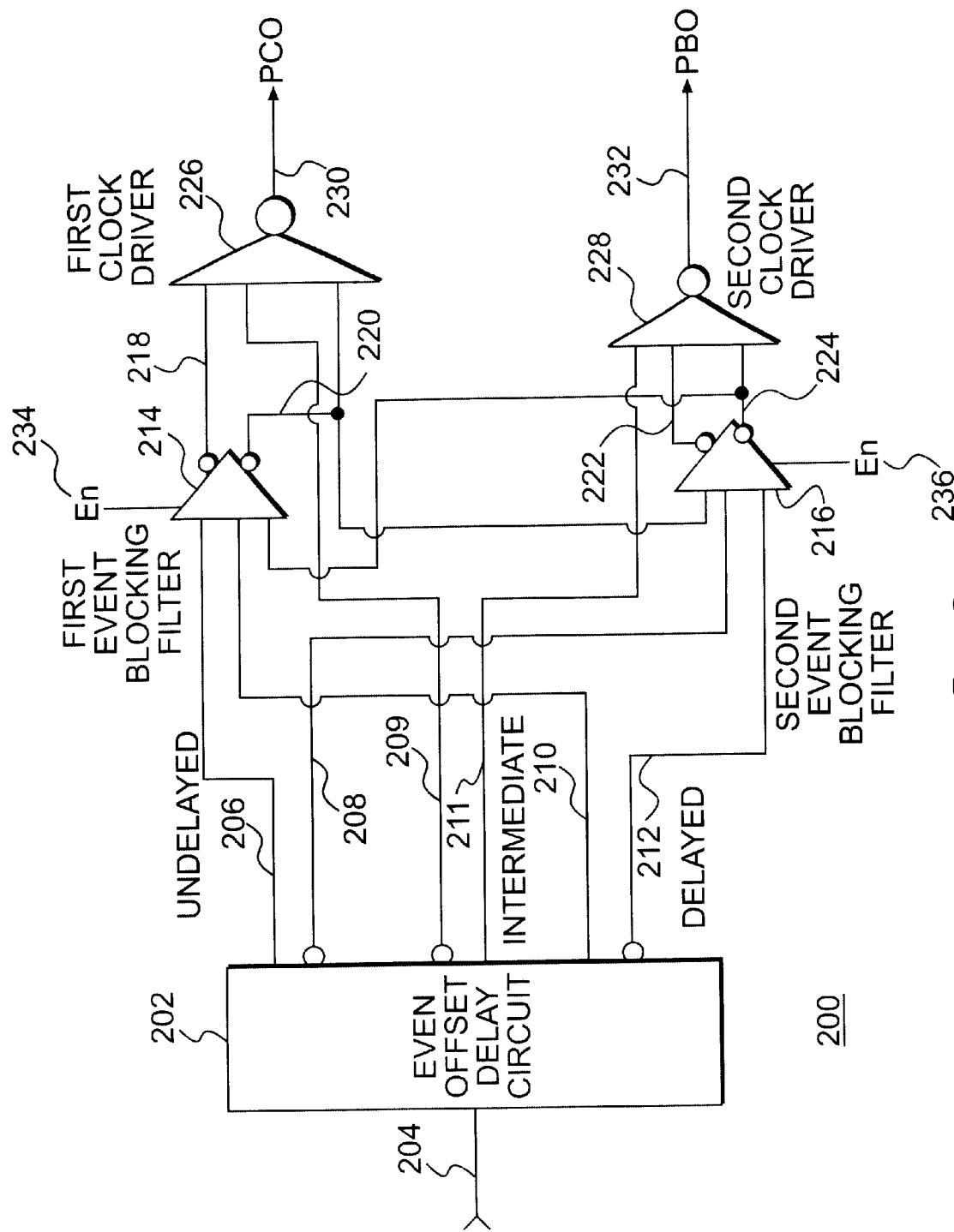
FIG. 2 is a block diagram of a first exemplary embodiment of a single event upset (SEU) and a single event effect (SEE) tolerant clock splitter circuit.

Turning now to the drawings and, more particularly, FIG. 2 is a block diagram of an exemplary embodiment of a single event upset (SEU) and single event effect (SEE) tolerant clock splitter circuit 200. The SEU tolerant clock splitter circuit 200 avoids the SEE sensitivity of inverter 108 of FIG. 1 and avoids false pulses from SEUs occurring in conventional clock tree circuits. The first exemplary embodiment of clock splitter circuit 200 includes an event offset delay circuit 202 that receives an input clock signal 204 and provides two pairs of complementary clock phase signals 206, 208 and 210, 212, as well as intermediate phase signals 209, 211. Clock phase signals 206 and 210 are inputs to an inverting event blocking filter 214. Clock phase signals 208 and 212 are inputs to a second inverting event blocking filter 216. In-phase outputs 218, 220 and 222, 224 of inverting event blocking filters 214 and 216 and intermediate phase signals 209, 211 are inputs to an inverting driver 226 or 228, respectively. The inverting event blocking filters 214 and 216, each have enable signals 234 and 236, respectively. Inverting drivers 226 and 228 each provide one of a pair of complementary non-overlapping clock phase outputs 230 and 232, respectively.

Inverting event blocking filter 214 compares undelayed clock phase signal 206 with a delayed clock signal 210. Inverting event blocking filter 216 compares undelayed clock phase signal 208 with delayed clock signal 212. In response to these comparisons, each event blocking filter 214, 216 provides a pair of inverted in-phase outputs 218, 220 and 222, 224, respectively. One phase signal 220 or 224 from a corresponding inverting event blocking filter 214 or 216 is passed as a feedback input to the other inverting event blocking filter 216 or 214, respectively.

The in-phase outputs 218, 220 and 222, 224 of each of inverting event blocking filters 214, 216, respectively, do not switch state until all inputs 206, 210 and 224, and 208, 212 and 220, respectively, are at the same logic level. Thus, both of clock phase outputs 206, 210 and, coincidentally, of 208, 212 must have switched states before in-phase outputs 218, 220 and 222, 224 switch. The delay of the event offset delay circuit 202 is sized such that the delayed outputs 210 and 212 are delayed from clock phases 206 and 208, respectively, by $t_{SEE}$, typically 0.5 ns for 0.5 $\mu$m logic.

Accordingly, a false clock pulse will never cause the inverting event blocking filters 214, 216, to switch because the delay of event offset delay circuit 202 insures that a false pulse perturbated by an SEE is not on both the undelayed output 206, 208 and the delayed output 210, 212, simultaneously. Intermediate clock phase signal 209 is selected to have the same polarity as and, to precede in phase outputs 218, 220. Intermediate clock phase signal 211 is selected to have the same polarity as and, to precede in phase outputs 222, 224. The inverting drivers 226, 228 switch only when all three inputs 209, 218, 220 and 211, 222, 224, respectively, have switched to the same level.

Thus, the inverting drivers 226, 228 ignore a false low pulse in event offset delay 202 or on either output of inverting event blocking filters 214, 216. The exemplary clock splitter 200 thereby avoids inadvertently driving the driver's PC0 clock output 230 or PB0 clock output 232 high in response to a SEE on nodes internal to the clock splitter 200.

Furthermore, the feedback input to event blocking filters 214, 216 must be high in order to drive the in-phase outputs 218, 220 and 222, 224 low. So, both event blocking filter 214, 216 output pairs 218, 220 and 222, 224, respectively, must be high before either output pair can be driven low. Thus, when these in phase pairs 218, 220 and 222, 224 are inverted by inverting drivers 226 and 228, the resulting pair of complementary clock phases 230, 232 are never high simultaneously and, therefore, are non-overlapping.

Figure 3:
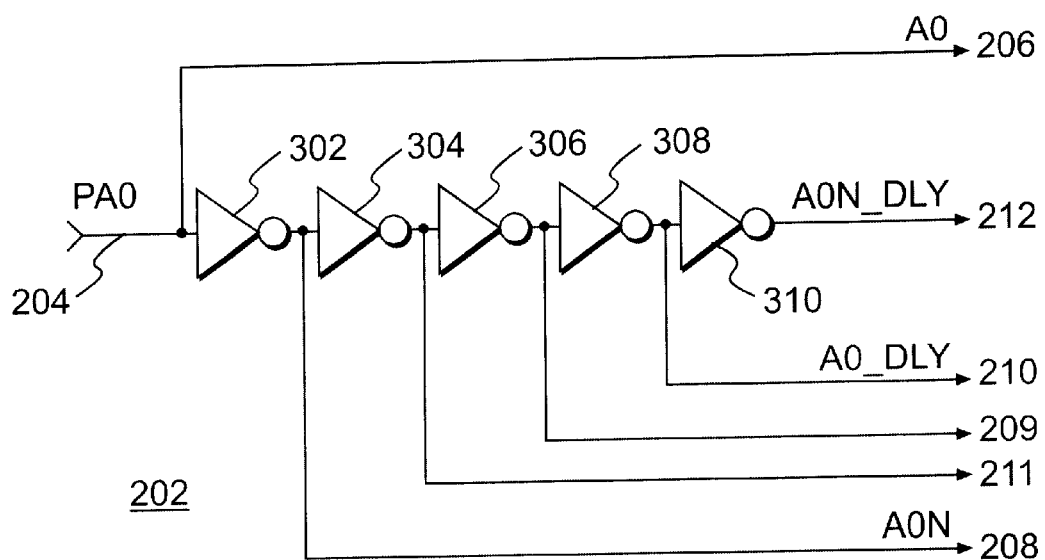
FIG. 3 is a schematic diagram of an exemplary embodiment of an event offset delay circuit.

FIG. 3 illustrates an exemplary embodiment of an event offset delay circuit 202. As noted above, a preferred delay circuit 202 is carefully sized to introduce a delayed input signal, wherein the delay is $t_{SEE}$. Although any suitable delay circuitry capable of providing the desired delay can be used, preferably, the event offset delay circuit 202 is formed by a series of inverters 302, 304, 306, 308 and 310. For this embodiment, $t_{SEE}$ is less than four times the delay through an inverter. The input clock signal 204 is passed forward as an undelayed, uninverted output 206 of event offset delay circuit 202 in FIG. 2. The input clock signal 204 also propagates through four inverters 302, 304, 306 and 308 to provide the delayed, uninverted output 210. The output of first inverter 302 is passed forward as an undelayed, inverted output 208. The output of last inverter 310 is delayed inverted output 212 and is also delayed from undelayed, inverted output 208 by stage delays from four inverters 304, 306, 308 and 310. Intermediate outputs 209, 211 correspond to the output and input of inverter 306, respectively.

Figure 4:
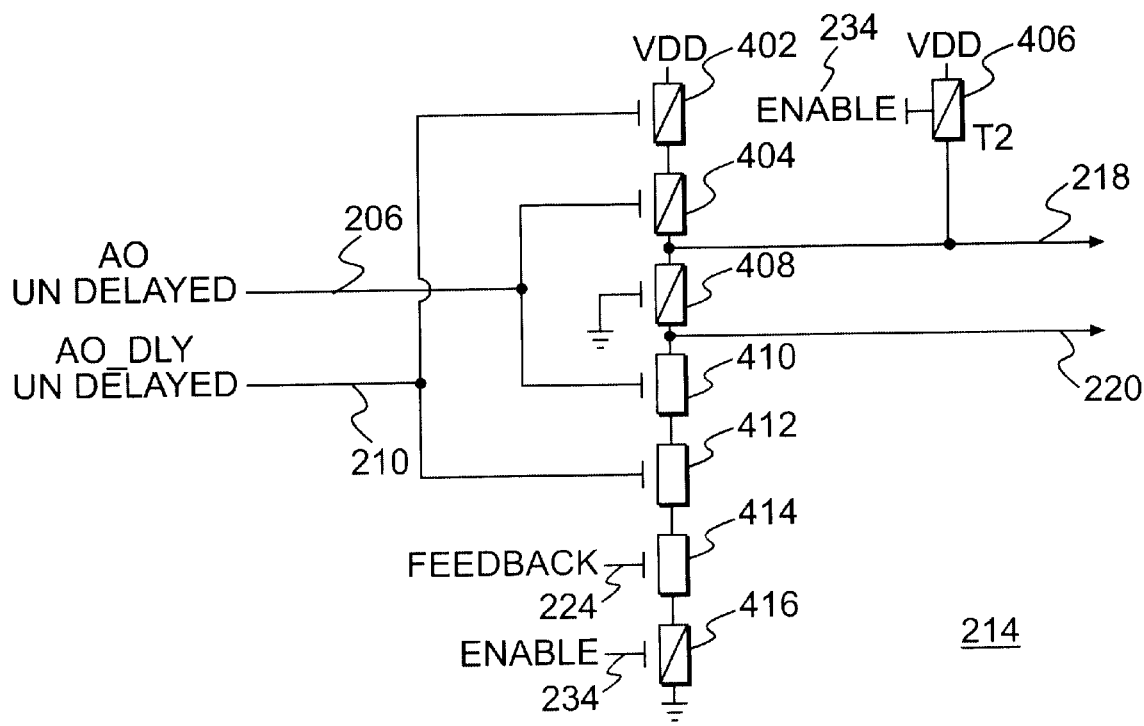
FIG. 4 is a schematic diagram of an exemplary embodiment of a first inverting event blocking filter.

FIG. 4 is an exemplary embodiment of a schematic diagram of an event blocking filter 214. A preferred event blocking filter 214 can include two series connected P-type field effect transistors (PFETs) 402, 404 in parallel with PFET 406, further in series with PFET 408. A drain-source region of PFET 402 can be coupled to a source-drain region of PFET 404. Source-drain regions of PFETs 402 and 406 are tied to a supply voltage, such as, e.g., (VDD). A drain-source region of PFET 408 can be coupled to a drain-source region of N-type field effect transistor (NFET) 410 which is one of four series coupled NFETs 410, 412, 414 and 416. A source-drain region of NFET 410 can be coupled to a drain-source region of NFET 412, which has its source-drain region connected to a drain-source region of NFET 414. A source-drain region of NFET 414 can be coupled to a drain-source region of NFET 416. A source-drain region of NFET 416 can be tied to ground. The drain-source region of PFETs 404 and 406 are coupled to a source-drain region of PFET 408 and a first output 218 of the pair of in-phase outputs. The PFET 408 has a drain-source region to the drain-source region of NFET 410 and a second output 220 of the pair of in-phase outputs. It will be apparent to those skilled in the art that FIG. 4 can also depict an embodiment of event blocking filter 216.

An undelayed output, i.e. 206 or 208 of an event offset delay circuit 202 of FIG. 2, is a first clock input at the gate of PFET 404 and the gate of NFET 410. A corresponding delayed output, 210, or 212 is a second clock input 210 at the gate of PFET 402 and NFET 412. An enable signal input 234 is provided to the gate of parallel PFET 406 and the gate of NFET 416. The gate of PFET 408 is grounded tying it on. A feedback input 224 is provided to the gate of NFET 414. As noted hereinabove, in-phase outputs 220 and 224 from event blocking filters 214 and 216, respectively, are cross-coupled. Output 220 from event blocking filter 214 is the feedback signal input 220 for the other event blocking filter 216. Similarly, output 224 is the feedback signal input 224 to event blocking filter 214.

When the enable input 234 is low, outputs 218 and 220 are held high. NFET 416 is off, blocking the path to ground from output 220. PFET 406 is on, holding in-phase output 218 high at VDD. Depending on its operational bias conditions, PFET 408 acts as a resistor or as a diode, coupling together in-phase outputs 218 and 220. Because output 218 held high by PFET 406, PFET resistor 408 pulls output 220 high and holds output 220 high. The state of other inputs is a "don't care."

When the enable signal input 234 is driven high to enable the event blocking filter 214, PFET 406 is turned off and NFET 416 is turned on supplying ground to the source-drain region of NFET 414. Initially, the feedback line 224 is high because the output of the previously not enabled filter 216 is high. The event offset delay circuit 214 compares the input clock phases 206 and 210 and, in response to the comparison, inverts and passes the clock signal on outputs 218 and 220. If both clock inputs 206, 210 are low, NFETs 410 and 412 remain off, PFETs 402 and 404 remain on and both outputs 218 and 220 remain high.

However, if both inputs 210, 206 are high when the event blocking filter 214 is enabled, PFETs 402 and 404 are off and NFETS 410 and 412 are on. NFET 414, being on, passes ground to the source-drain region of NFET 412. So, with all NFETs 410, 412, 414 and 416 on, in-phase output 220 is pulled low to ground. With the drain-source region of PFET 408 grounded, $V_{DS}=V_{GS}$ and PFET 408 acts as a diode to pull the other in-phase output 218 down. However, since PFET 408 acts as a diode, in-phase output 218 is not pulled completely to ground, but to a voltage equal to the magnitude of the threshold voltage (the diode voltage) of PFET 408.

Thus, with the outputs 218, 220 of one event blocking filter 214 being low, the feedback input 220 to the other event blocking filter 216 also is low. Similarly, with outputs 222 and 224 of event blocking filter 216 being low, the feedback input 224 to event blocking filter 214 also is low. In the event blocking filter 214 with its feedback input 224 low, NFET 414 is off, closing the path to ground, which prevents the outputs 218, 220 from switching low. So, as long as the feedback input 224 is low, the event blocking filter 214 clock inputs 210, 206 are ignored and outputs 218, 220 stay high. The event blocking filter 214 cannot switch until the feedback input 224 is high. Cross coupling these outputs 220, 224 guarantees that there is some period during switching when the in-phase outputs 218, 220 and 222, 224 are high, simultaneously. Therefore, the clocks 230, 232 from inverting drivers 226 and 228, respectively, are never both high and so, are non-overlapping.

Event blocking filter 216 has inputs 208, 220 and 212 corresponding to inputs 206, 224 and 208, respectively, of FIG. 4. Event blocking filter 216 also has outputs 222 and 224 corresponding to outputs 218 and 220, respectively, of FIG. 4.

It should be noted that if a clock enable 234 is unnecessary, NFET 416 and PFET 406 can be omitted. Also, the feedback 224 between clocks can be omitted by omitting NFET 414.

Figure 5:
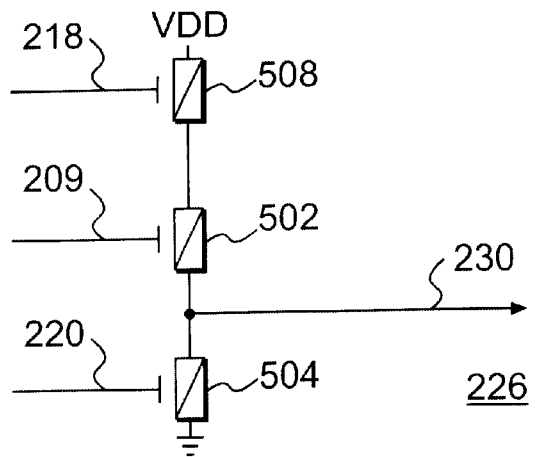
FIG. 5 is a schematic diagram of an exemplary embodiment of an inverting driver.

FIG. 5 is a schematic diagram of an exemplary embodiment of an inverting driver 226 such as can be used for inverting drivers 226 and 228 of exemplary embodiment 200 of FIG. 2. The inverting driver 226 can include a PFET 502 and an NFET 504 tied together at their drain-source regions and coupled to the clock output 230. The drain-source region of a second PFET 508 can be tied to the drain-source region of PFET 502. The source-drain region of the PFET 508 can be coupled to VDD and the source-drain region of the NFET 504 can be coupled to ground. The intermediate clock 209 of FIG. 2 (or 211 for inverting driver 228) is the input 209 to the gate of PFET 502. The input 220 to the gate of NFET 504 is one in-phase output 220. The input 218 to the gate of PFET 508 is driven from the other in-phase output 218. It should be noted because PFET 408 is acting as a diode when filter outputs 218, 220 are low, the gate of PFET 508 is never pulled completely to ground and, so, sees a reduced drive, when it is turned on. For inverting driver 228, input 218 of FIG. 5 corresponds to input 222, input 209 of FIG. 5 corresponds to input 211, and input 220 of FIG. 5 corresponds to input 224. Output 230 of FIG. 5 corresponds to input 232 of inverting driver 228.

Figure 6:
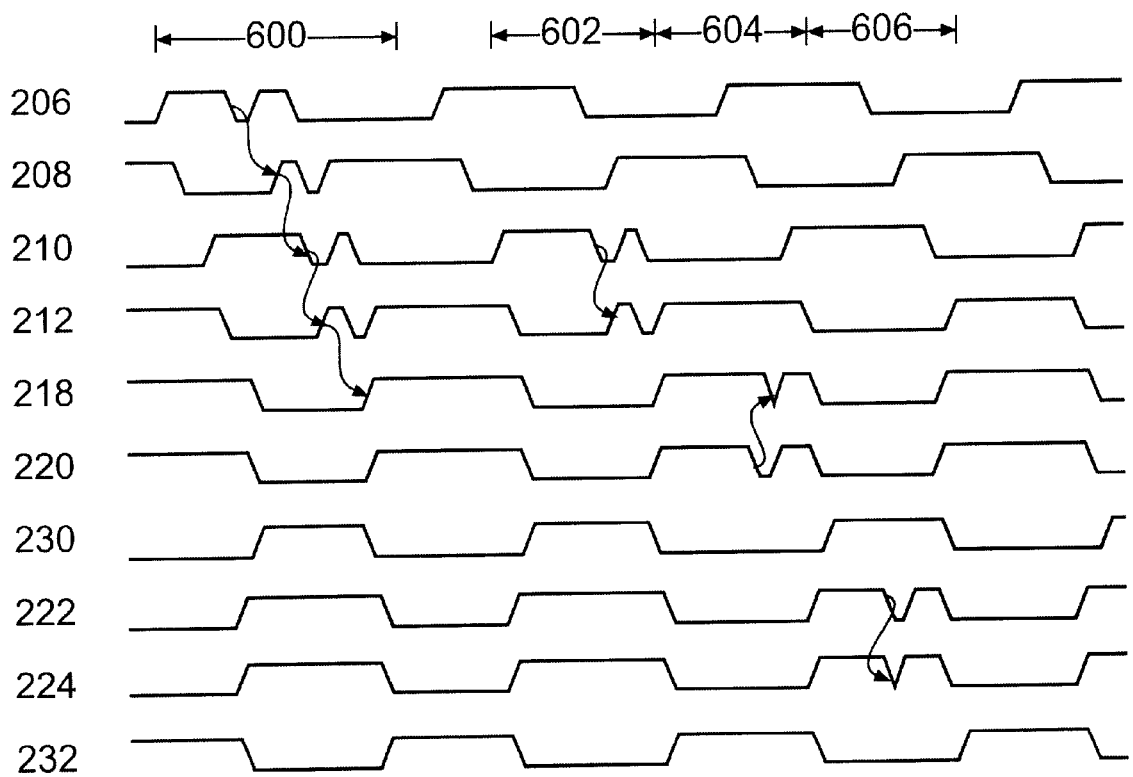
FIG. 6 is a timing diagram illustrating events occurring at various locations prior to and within the first exemplary embodiment SEU tolerant clock splitter circuit.

FIG. 6 is a timing diagram that illustrates events occurring in the clock tree prior to, as well as within the exemplary embodiment SEU tolerant clock splitter circuit 200. The period labeled 600 represents an SEU occurring in the timing tree, prior to the preferred embodiment SEU tolerant clock splitter circuit 200. The event causes a false clock pulse shown in the figure that propagates, as represented by the arrows, through the event offset delay 202. However, because the propagation delay through the event offset delay 202 is the same length as the SEU, the event edges never line up such that the event blocking filters 214, 216 would switch. Accordingly, the event blocking filters 214, 216 have filtered out the SEU and nothing is reflected on either pair of event blocking filter outputs 218, 220 or 222, 224 or on the clocks 230, 232 generated therefrom.

Next, in the period labeled 602, an upset is shown occurring in the event offset delay 202 at, for example, inverter 306 in FIG. 3. Just as with the event occurring prior to the event offset delay 202 in period 600, this upset in the event offset delay 202 is blocked at the event blocking filters 214, 216 by the undelayed clock input.

In the period labeled 604, an upset is shown on the in-phase output 220 of event offset filter 214. While the upset output 220 is discharged and pulled low, the other in-phase output 218 is only minimally pulled below VDD. Since both PFETs 402 and 404 of FIG. 4 are on, they form a voltage divider with on PFET 408, limiting how low PFET 408 can pull output 218. PFETs 402 and 404 are designed to have a smaller active resistance than PFET 408 and, therefore, prevent PFET 408 from pulling output 218 much below VDD. Further, intermediate clock phase 209 remains high, keeping PFET 502 of inverting driver 226 turned off, blocking any current that PFET 508 might supply. The clock output PC0 230 is unperturbed.

Finally, in the period labeled 606, an upset is shown on the output 222 of event blocking filter 216. While the upset is of sufficient magnitude to pull the output 222 low turning on PFET 508 of inverting driver 228, output 224 remains high keeping NFET 504 of inverting driver 228 on. NFET 504 is designed to be large enough to maintain a low output on line 232 under these conditions. PFET 408, acting as a diode, pulls the other event offset filter output 224 down, slightly, but not enough to turn driver NFET 504 off, sufficiently that the clock output might rise to a level of any concern. Accordingly, the SEE never reaches latches that the clocks 230, 232 are clocking. However, again, intermediate clock phase 211 remains unchanged, i.e., high, keeping PFET 502 of inverting driver 228 turned off, blocking any current that PFET 508 might supply. The clock output PB0 232 is unperturbed.

Figure 7:
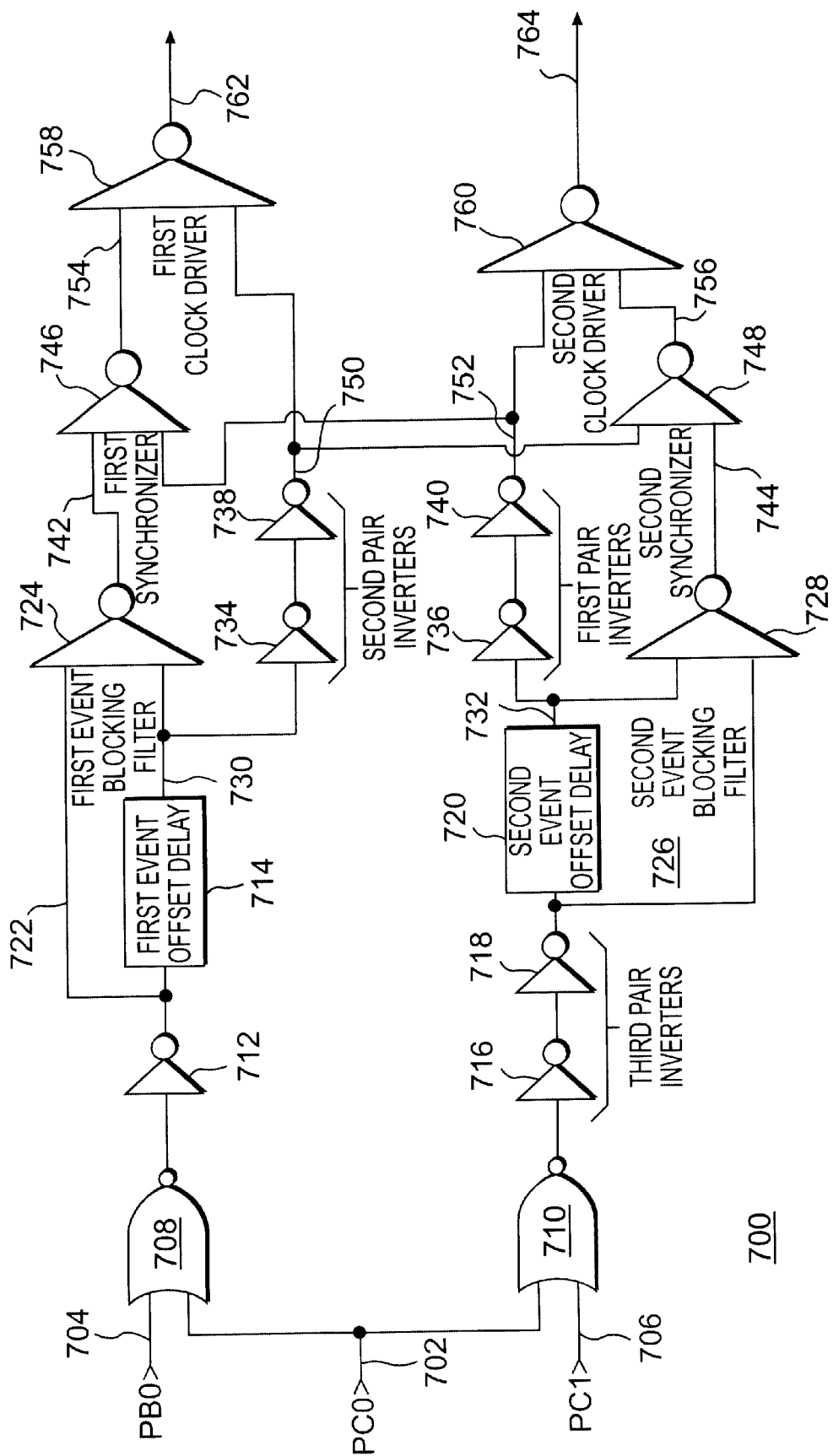
FIG. 7 is a block diagram of a second exemplary embodiment of a single event upset SEU and an SEE tolerant clock splitter circuit.

FIG. 7 is a block diagram of another exemplary embodiment of a single event upset (SEU) tolerant clock splitter circuit 700. In the SEU tolerant clock splitter circuit 700, a PC0 clock signal input 702 is split into two identical complementary paths, or buffers, which can be cross coupled. Circuit 700 advantageously permits the use of a single clock PC0 or separate clocks PB0 and PC1. The clocks permit full independent alternate test control. Each buffer includes an individual test clock signal input PB0 704, and PC1 706. Thus, in one buffer, individual test clock signal PB0 704 and clock signal input PC0 702 are inputs to a NOR gate 708. In the other buffer, individual test clock signal PC1 706 and clock signal input PC0 702 are inputs to a NOR gate 710. An output of NOR gate 708 is an input to an inverter 712. An output 722 of inverter 712 is coupled to an input to a delay circuit 714. An output of NOR gate 710 is coupled to an input to inverter 716. An output of inverter 716 is coupled to an input to an inverter 718. An output 726 of inverter 718 is coupled to an input to a delay circuit 720. The output 722 of inverter 712 is also an input to an event blocking filter 724. The output 726 of inverter 718 is also an input 726 to an event blocking filter 728.

The output 730 of delay 714 is a second input to event blocking filter 724. Output 732 of delay 720 is a second input to event blocking filter 728. Additionally, the outputs 730, 732 of delays 714 and 720, respectively, are inputs to inverters 734 and 736, respectively. The output of inverter 734 is coupled to an input to an inverter 738. An output of inverter 736 is an input to inverter 740. The outputs 742, 744 of event blocking filters 724 and 728, respectively, are first inputs to synchronizers 746 and 748, respectively. An output 750 of inverter 738 is a second input to synchronizer 748 and an output 752 of inverter 740 is a second input to synchronizer 746, effectively cross-coupling the parallel delay buffers at the synchronizers 746, 748.

Finally, the output 754 of synchronizer 746 and the output 750 of inverter 738 are an in phase pair of inputs to driver 758, analogous to in phase pair 218, 220 of FIG. 2. Likewise the output 756 of synchronizer 748 and the output 752 of inverter 740 are an in phase pair of inputs to driver 760. Drivers 758, 760 provide a pair of none overlapping clock outputs 762 and 764, respectively.

Accordingly, for the SEU tolerant clock splitter circuit 700, event blocking filters 724, 728, synchronizers 746, 748 and drivers 758, 760 are not typical logic circuits. Event offset delay circuits 714, 720 can in one embodiment include four (4) series connected inverters as shown, for example, in the event offset delay circuit 202 of FIG. 3. Event offset delay circuit 202 can have input PA0 204 and output A0_DLY 210 delayed by 0.1 ns, with other outputs being ignored. Alternatively, more or fewer inverter stages can be included by altering inverter FET gate length which can alter the inverter stage delay. For example, longer FET gate lengths can be used for longer individual inverter delays, or shorter FET gate lengths can be used for shorter individual inverter delays. Accordingly, the number of inverter stages is dependent upon individual stage delay and the desired resulting delay which can in one embodiment be preferably, 1.0 ns.

Figure 8:
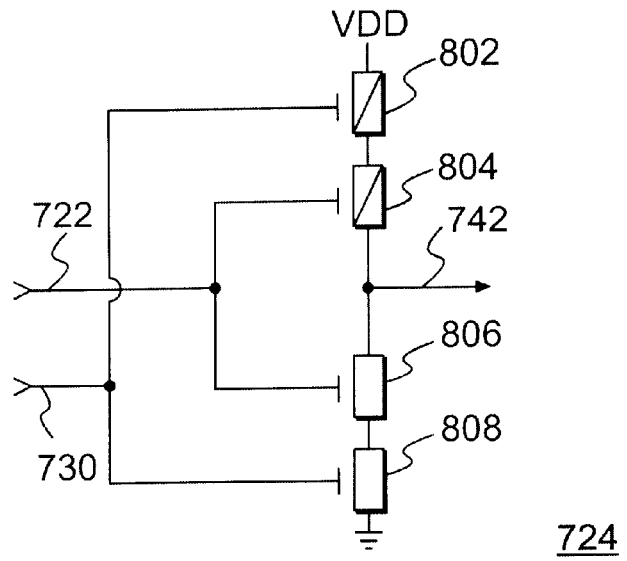
FIG. 8 is a schematic diagram of an exemplary embodiment of a second event blocking filter.

FIG. 8 is a schematic diagram of an exemplary embodiment of the event blocking filter 724. The diagram depicted in FIG. 8 can also be used as the event blocking filter 728 of FIG. 7. A preferred event blocking filter 724 can include two series coupled PFETs 802 and 804 and two series coupled NFETs 806 and 808. The drain-source region of PFET 802 can be coupled to the source-drain region of PFET 804. The source-drain region of PFET 802 can be coupled to VDD. The drain-source region of PFET 804 can be coupled to the drain-source region of NFET 806. The source-drain region of NFET 806 can be coupled to the drain-source region of NFET 808. The source-drain region of NFET 808 can be coupled to ground.

A gate of PFET 802 can be coupled to a gate of NFET 808, and can be coupled to input 730. A gate of PFET 804 can be coupled to a gate of NFET 806 and can be coupled to input 722. The drain-source region of PFET 804 can be coupled to the drain-source region of NFET 806 and can be coupled to the output 742. As with the inverting driver 226 of FIG. 2, the event blocking filter 724 switches when both inputs 730 and 722 have switched and are at the same level. When inputs 730, 722 are not at the same level, output 742 remains unchanged.

Figure 9:
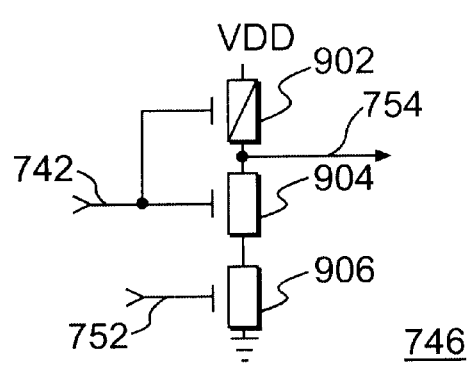
FIG. 9 is a schematic diagram of an exemplary embodiment of a synchronizer circuit.

FIG. 9 is a schematic diagram of an exemplary embodiment of a synchronizer 746. The synchronizer 746 can also be used as synchronizer 748. The synchronizer 746 can in one embodiment include a single PFET 902 coupled at its drain-source region to series coupled NFETs 904, 906. The source-drain region of PFET 902 can be coupled to VDD. The output 754 can be coupled to the commonly coupled drain-source region of PFET 902 and drain-source region of NFET 904. The source-drain region of NFET 904 can be coupled to the drain-source region of NFET 906. The source-drain region of NFET 906 can be coupled to ground. The gates of PFET 902 and NFET 904 can be commonly coupled to the input 742 from the output of event blocking filter 724. The input 752 to the gate of NFET 906 can be coupled to output 752 of inverter 740 of the first inverter pair. Accordingly, PFET 902 and NFET 904 form an inverter with NFET 906 providing an enable to prevent the output from being pulled low before the input 752 is high. Accordingly, each event blocking filter 724 and its corresponding synchronizer 746 can combine to provide the function of event blocking filter 214 of the first embodiment.

Figure 10:
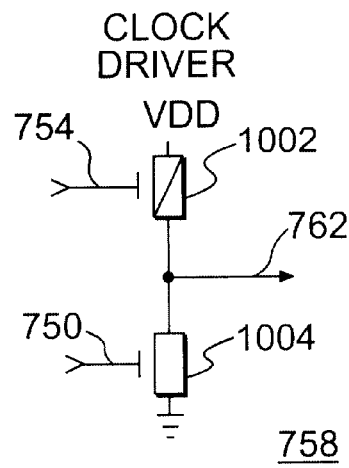
FIG. 10 is a schematic diagram of an exemplary embodiment of a second inverting driver.

FIG. 10 is a schematic diagram of an exemplary embodiment of an inverting driver 758. Inverting driver 760 could also use a circuit similar to that shown in FIG. 7. The inverting driver 758 can include a PFET 1002 and an NFET 1004 that can be tied together at their drain-source regions to the clock output 762. The source-drain region of the PFET 1002 can be coupled to VDD and the source-drain region of the NFET 1004 can be coupled to ground. The input 754 to the gate of PFET 1002 can be the output 754 from synchronizer 746. The input 750 to the gate of NFET 1004 can be coupled to output 750 of inverter 738 of the second inverter pair.

Figure 11:
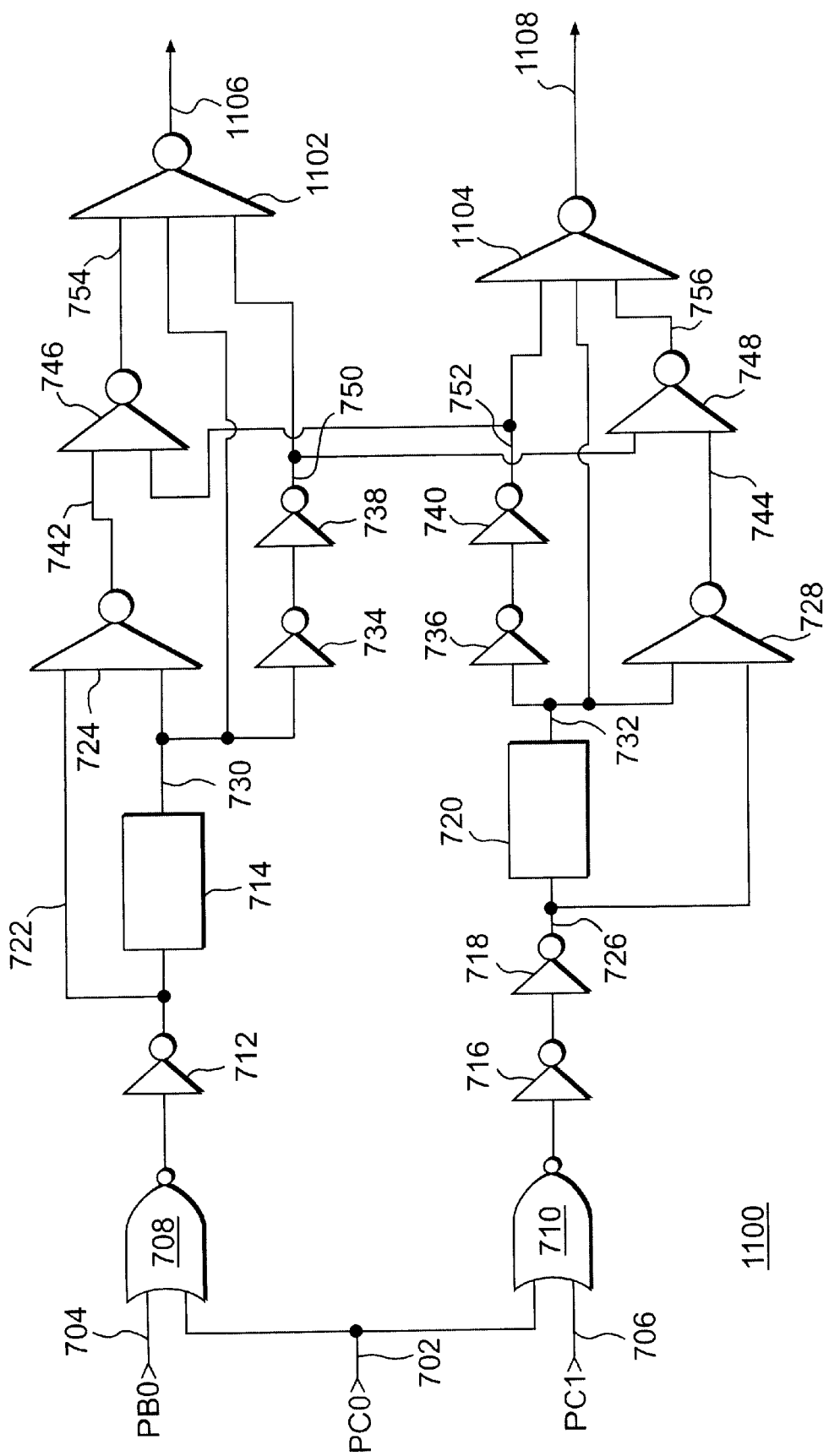
FIG. 11 is a block diagram of a third exemplary embodiment of an SEU and an SEE tolerant clock splitter circuit.

FIG. 11 is a block diagram of yet another exemplary embodiment of a Single Event Upset tolerant clock splitter circuit 1100. SEU tolerant clock splitter circuit 1100 is suitable for unhardened clock trees where low power and low frequency operation is desirable. Primarily, circuit 700 of FIG. 7 and circuit 1100 differ in that inverting drivers 1102, 1104 differ from inverting drivers 758, 760. In circuit 1100, in one embodiment, inverting drivers 1102, 1104 can use drivers 226 as depicted in FIGS. 2 and 5. Inverting driver 1102 can receive as inputs, output 754 from synchronizer 746, output 750 from inverter 738 of the second inverter pair, and output 730 from event offset delay 714 and can generate a clock phase output 1106 therefrom. Inverting driver 1104 can receive as inputs, output 756 from synchronizer 748, output 752 from inverter 740 of the first inverter pair, output 732 from event offset delay 720, and can generate a clock phase output 1108 therefrom.

Figure 12:
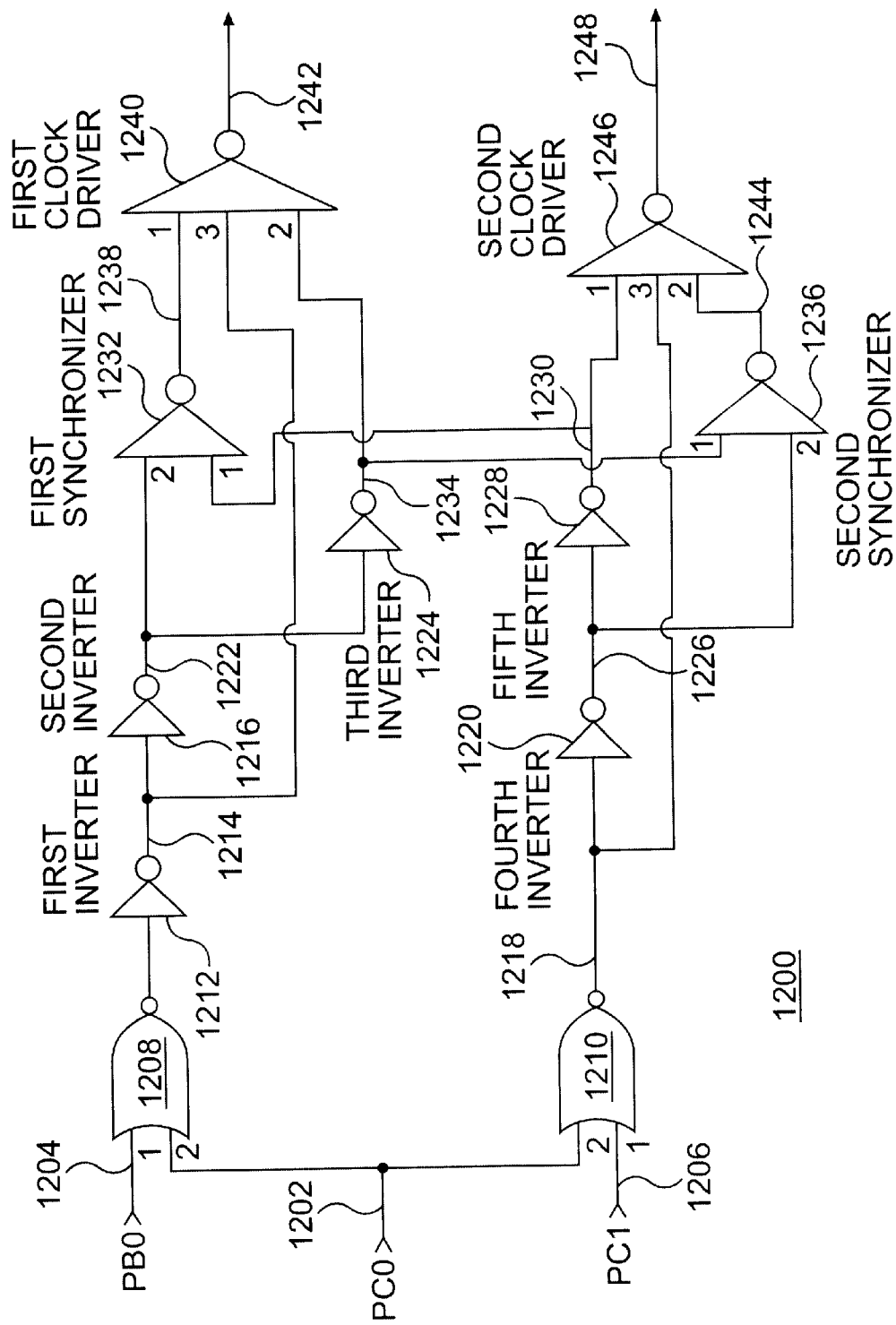
FIG. 12 is a block diagram of a fourth exemplary embodiment of an SEU and an SEE tolerant clock splitter circuit.

FIG. 12 is a block diagram of another exemplary embodiment of a Single Event Upset tolerant clock splitter circuit

1200. SEU tolerant clock splitter circuit 1200 is suitable for hardened clock trees where higher performance and high frequency operation is desirable. In circuit 1200, the PC0 clock input 1202 is split into two identical complementary paths, or buffers, which can be cross coupled. Each buffer can include an individual test clock inputs PB0 1204 and PC1 1206. Thus, in one buffer, individual test clock (PB0) input 1204 and clock (PC0) input 1202 are inputs to a NOR gate 1208. In the other buffer, individual test clock input (PC1) 1206 and clock (PC0) input 1202 are inputs to a NOR gate 1210. The output of NOR gate 1208 is the input to inverter 1212. The output 1214 of inverter 1212 is an input to delay inverter 1216. The output 1218 of NOR gate 1210 is the input to inverter 1220. The output 1222 of inverter 1216 is the input to inverter 1224. The output 1226 of inverter 1220 is the input to inverter 1228.

The output 1222 of inverter 1216 and the output 1230 of inverter 1228 are inputs to a first synchronizer 1232. The output 1226 of inverter 1220 and the output 1234 of inverter 1224 are inputs to a second synchronizer 1236. Inverter 1212 output 1214, synchronizer 1232 output 1238 and inverter 1224 output 1234 are inputs to inverting driver 1240 which drives a first clock output 1242. NOR gate 1210 output 1218, synchronizer 1236 output 1244 and inverter 1228 output 1230 are inputs to inverting driver 1246 which drives a first clock output 1248.

Synchronizer 746 in FIG. 9 can be used for synchronizers 1232 and 1236. Also, in circuit 1200, in one embodiment, inverting drivers 1240 and 1246 can include inverting drivers 226 as shown in FIG. 5. The remaining elements can include additional logic gates.

Figure 13A:
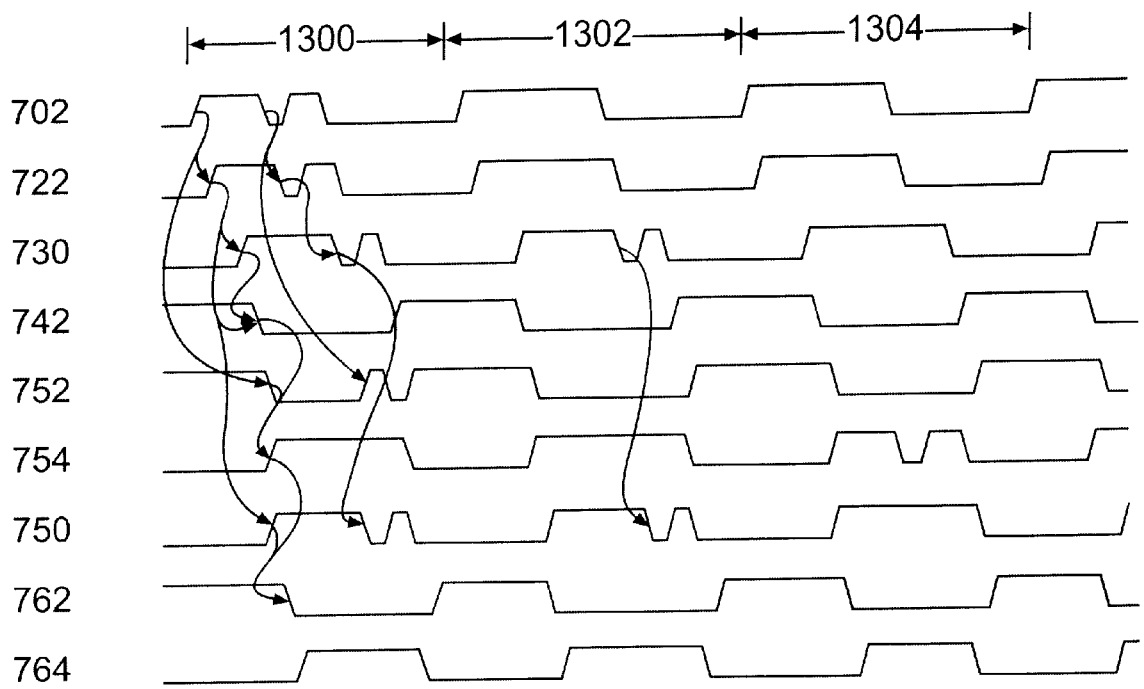
FIGS. 13A–B are exemplary timing diagrams exhibiting the event blocking ability of the exemplary embodiments of FIGS. 7, 11 and 12.
Figure 13B:
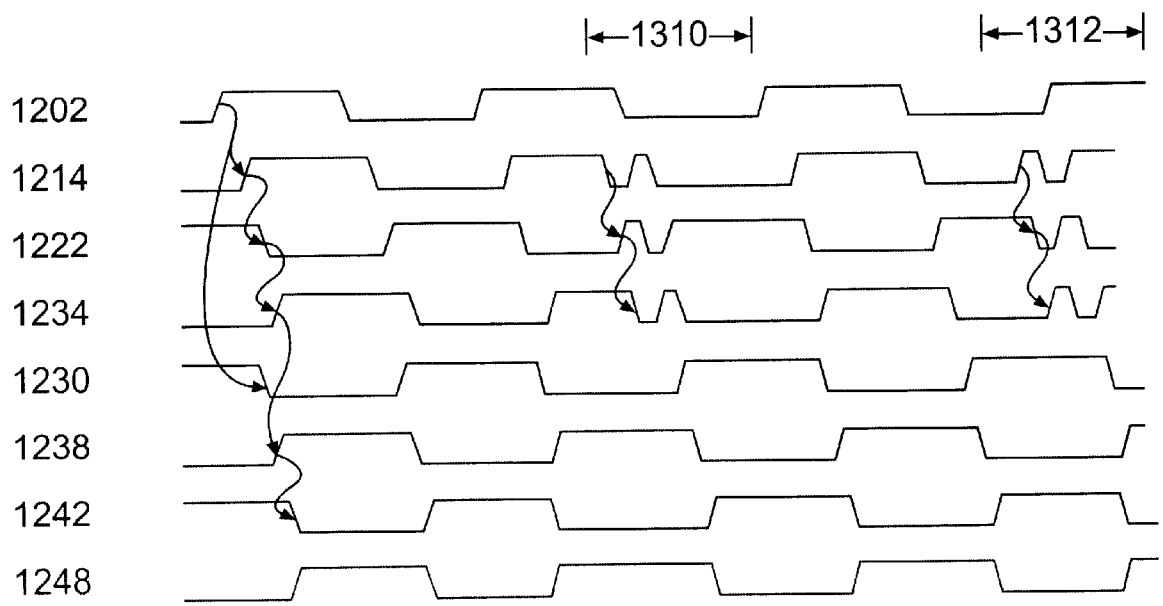

FIGS. 13A–B are exemplary timing diagrams exhibiting the event blocking ability of the exemplary embodiments of FIGS. 7, 11 and 12. As is noted above, the circuits 700, 1100 and 1200 of FIGS. 7, 11 and 12, respectively, each include two identical cross coupled parallel buffers. Thus, timing for one of the two identical buffers is shown and described for brevity. Further, since the exemplary embodiment of FIG. 11 is substantially similar to the exemplary embodiment of FIG. 7, a single timing diagram, FIG. 13A, is equally representative of the operation of both embodiments.

Accordingly, the period marked 1300 of FIG. 13A represents an SEU occurring in the timing tree, prior to the SEU tolerant clock splitter circuits 700 or 1100. The event causes a false clock pulse shown in the figure that propagates, as represented by the arrows, through the event offset delay circuit 714. However, because the propagation delay through the event offset delay circuit 714 is the same length as the SEU, the event edges never line up such that the event blocking filters 724, 728 would switch. Accordingly, the event blocking filters 724, 728 have filtered out the SEU and nothing is reflected on the event blocking filter output 742, as shown in FIG. 8, or as shown in FIG. 10 on the clock 762 (or 1106) generated therefrom or on corresponding complementary clock 764 (or 1108).

Next, in the period labeled 1302, an upset is shown occurring in event offset delay circuit 714 at, for example, inverter 304 in FIG. 3. Just as with the event occurring prior to event offset delay circuit 714, in period 1300, this upset in event offset delay circuit 714 is blocked at the event blocking filters 724 by the undelayed clock input 722, in this example. As will be apparent to those skilled in the art, in general, a rising edge is more important than a falling edge.

In the period labeled 1304, an upset is shown on output 754 of synchronizer 746. While the upset output 754 is discharged and pulled low, the other input 750 to inverting driver 758 of FIG. 10 is undisturbed holding driver NFET 1004 on. The clock output 754 is unperturbed. In FIG. 7, if an SEU strikes an output node 754 or 756 of first synchronizer 746 or second synchronizer 748, respectively, the outputs 762, 764 of first clock driver 758 and second clock driver 760 can be affected. Similar strikes will not affect the circuits of FIG. 11 or FIG. 12.

FIG. 13B is an exemplary timing diagram for the circuit 1200 of FIG. 12. It should be noted that, due to the omission of an event offset delay circuit in the circuit 1200 of FIG. 12, an SEE in the clock tree prior to the clock splitter 1200 very likely will not be rejected unless the event is of a relatively short duration. However, clock splitter 1200 is capable of withstanding the occurrence of an event in the clock splitter itself using inverting drivers 1240 and 1246 as is evident in the period labeled 1310 of FIG. 13B. The period labeled 1310 shows an exemplary event occurring in NOR gate 1208 or inverter 1212. While the event effects can propagate through inverters 1216 and 1224, the effects are blocked by synchronizer 1232 and inverting driver 1240 and, therefore, are not reflected in clocks 1242 and 1248. The period labeled 1312 of FIG. 13B shows an event occurring in inverter 1216. Again, while the event effects propagate through invertor 1224, the effects are blocked by synchronizer 1232 and inverting driver 1240 and, therefore, are not reflected in clocks 1242 and 1248.

Figure 14A:
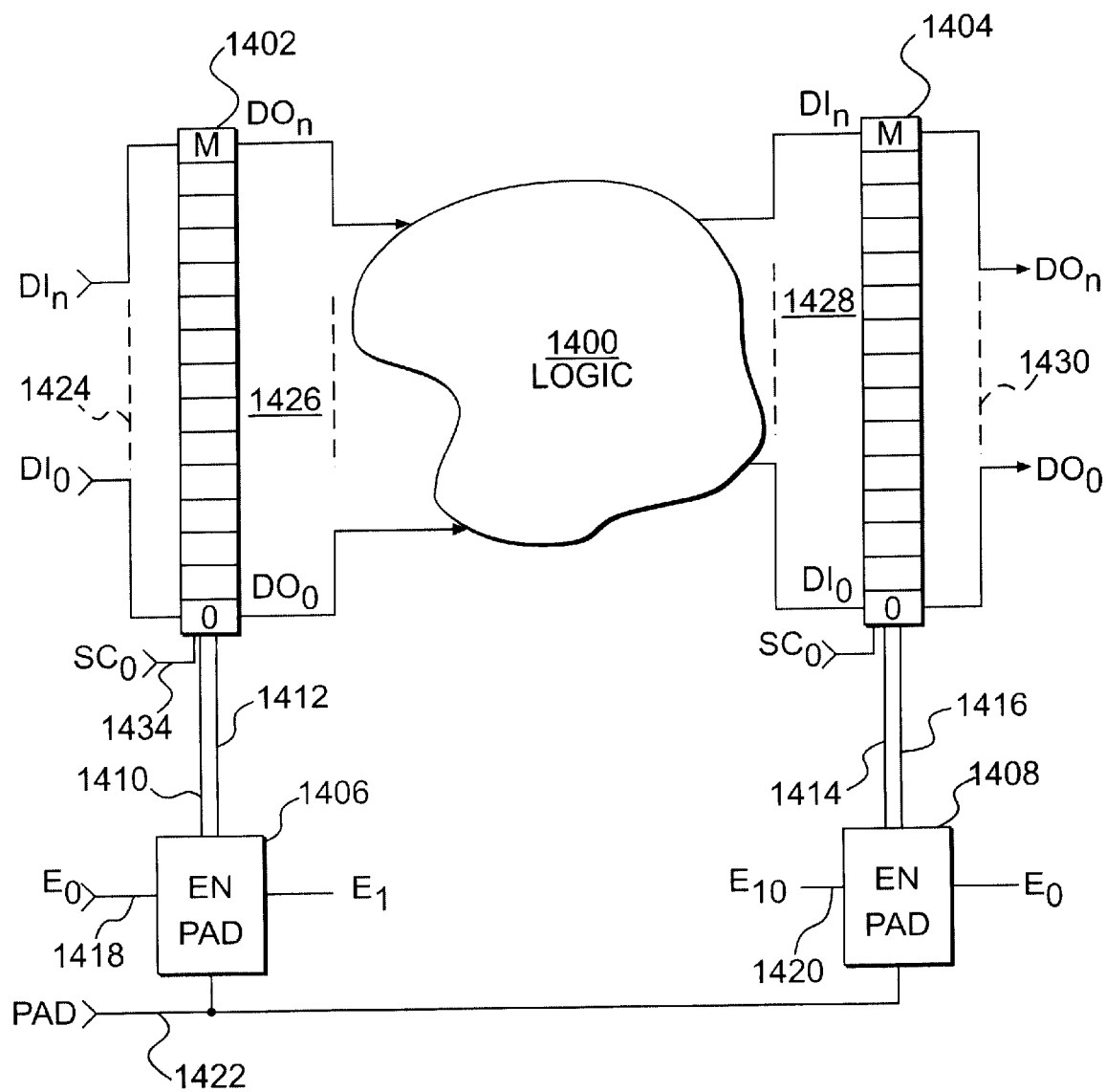
FIG. 14A is a cross-sectional diagram of an exemplary embodiment of an integrated circuit chip for space-based applications with level sensitive scan design (LSSD) testable logic between two registers according to the present invention.

FIG. 14A is a cross sectional view of an exemplary embodiment of an integrated circuit (IC) chip for space-based applications. Level sensitive scan design (LSSD) testable logic 1400 is bounded by two serially scannable registers 1402, 1404. Each register 1402, 1404, is clocked by an independent clock driver 1406, 1408 that includes one or more of the SEU tolerant clock splitter circuits 200 of FIG. 2. Clock output pairs 1410, 1412 and 1414, 1416 from each clock driver 1406, 1408 can be provided to registers 1402 and 1404, respectively. Each pair represents one or more pairs of clock splitter circuit outputs 230 and 232.

During normal operation, all latches of the registers 1402, 1404 can operate as scan-d flip flops (scan dff) and can be set to select a data or logic input. Both clock enables 1418, 1420 are high, enabling both clock drivers 1406, 1408. Input clock 1422 can be buffered and split in clock drivers 1406, 1408 and then passed as clock output pairs 1410, 1412 and 1414, 1416 to registers 1402, 1404, which are operating as scan dff registers.

In a typical cycle of clock 1422, input data from other logic (not shown) can be passed to register 1402 on inputs $DI_0-DI_n$ 1424. Data, latched in register 1402 in the previous clock cycle, can pass out of register 1402 on outputs $DO_0-DO_n$ 1426, propagating through logic 1400 to inputs 1428 of register 1404. Register 1404, in turn, can pass data that was latched in the previous clock cycle on outputs $DO_0-DO_n$ 1430 to a subsequent logic function, also not shown. On the subsequent clock cycle, data from logic 1400 can be latched in register 1404 and, on the next subsequent cycle, register 1404 can pass that latched data to subsequent logic.

Figure 14B:
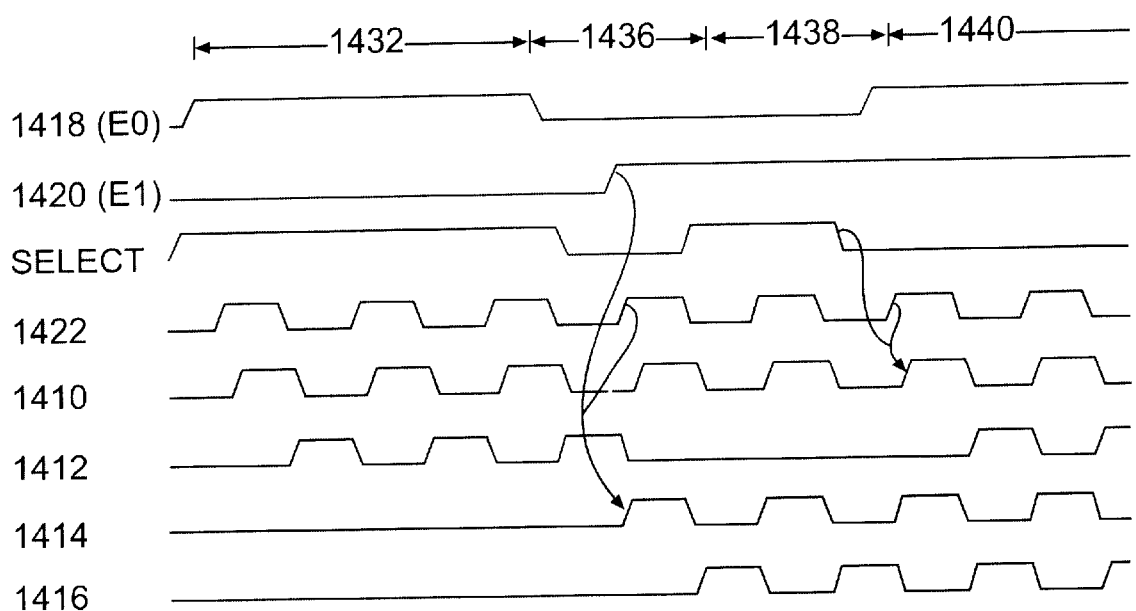
FIG. 14B is an exemplary timing diagram for the IC illustrated in FIG. 14A.

FIG. 14B is an exemplary timing diagram of a typical LSSD test for the IC chip of FIG. 14A. In the first test phase as represented in the period labeled 1432, the latches operate as LSSD latches. Latches in the register 1402 are set, as represented by SELECT, to select a SCANIN input, thus configuring register 1402 as a first-in first-out (FIFO) serial register. Initially, the SEU clock splitter enable signals E0, E1 are low. Enable E0 1418 is driven high, individually, selecting one register 1402 by enabling clock splitters 200 in clock driver 1406. The clocks 1414, 1416 for unselected register 1404 can be held low, because enable E1 1420 is low in this example. So, in the first test phase 1432, the enabled clocks 1410, 1412 clock register 1402 to serially scan test data in on $SC_0$ 1434 (which is the SCANIN input for the scan chain) until test data is loaded into register 1402.

After loading test data into register 1402, in test phase 1436, enable E0 1418 can be driven low to disable clocks 1410, 1412 and the latch data inputs can be selected as represented by SELECT switching state. Then, enable E1 1420 can be driven high to enable SEU clock splitters 200 in clock driver 1408. After a single pulse on the PA0 clock 1422, results of the test data on the logic can be captured in the first level sensitive latches in register 1404.

Next, in test phase 1438, the SCANIN input 1434 can be selected again as represented by SELECT switching states. The captured test results can be serially scanned out on $DO_n$. Finally, the circuit can be returned to normal operation in phase 1440 as the data input is selected for all latches and both clock drivers 1406, 1408 can be enabled.

Thus, the entire logic function 1400 can be tested using either ATPG or LSSD techniques, while operating normally as a scan dff design that has additional, normally unavailable SEE hardening. Further, the preferred embodiment hybrid design eliminates the LSSD need for individual A0, C0 clocks.

Figure 15B:
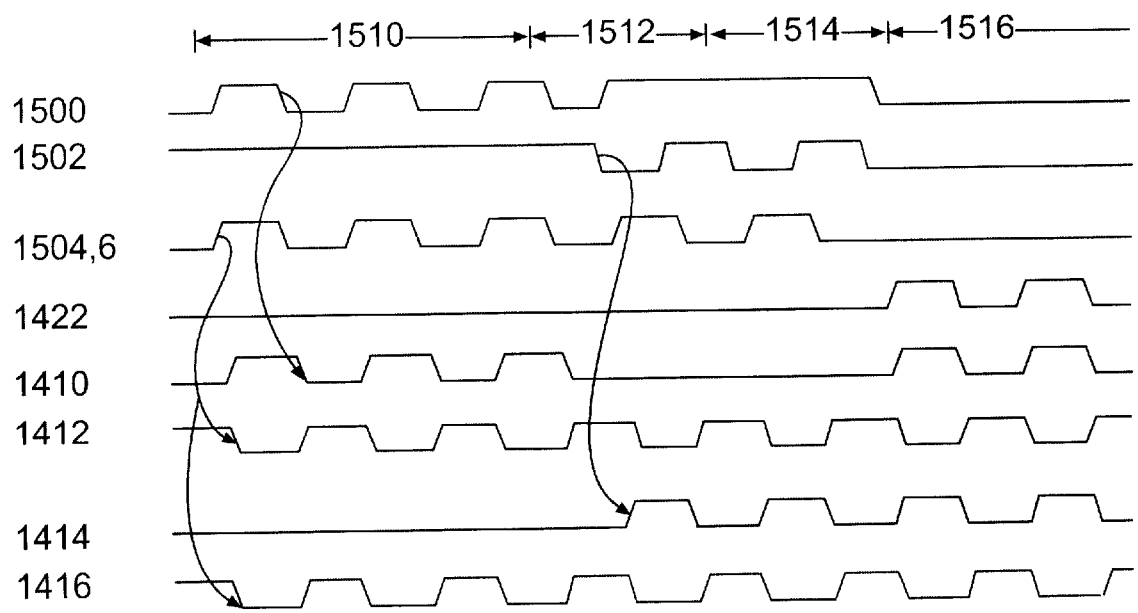
FIGS. 15A–B are an exemplary variation on the integrated circuit chip of FIGS. 14A–B with clock drivers including second, third or fourth exemplary embodiment clock splitters.
Figure 15A:
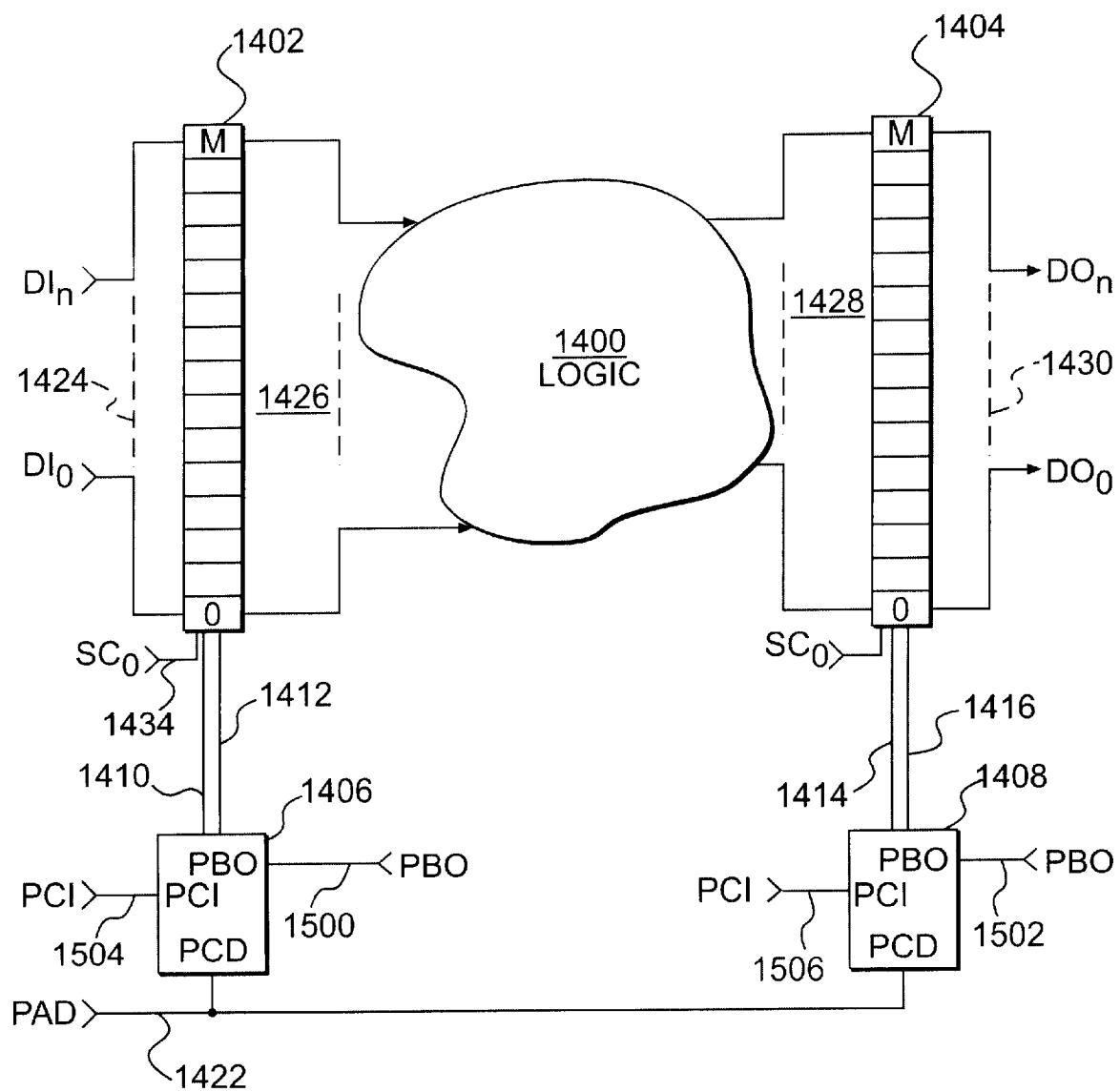

FIGS. 15A–B depict an example of a variation on the integrated circuit chip of FIGS. 14A–B, with like numbered elements being substantially identical and wherein the clock drivers 1406, 1408 can include clock splitter circuits 700, 1100 or 1200, respectively. Thus, in FIG. 15A, the clock drivers 1406, 1408 can each have a PB0 input 1500, 1502 and a PC1 input 1504, 1506.

FIG. 15B is an example of a timing diagram for the chip of FIG. 15A. The timing diagram of FIG. 15B is substantially similar to that of FIG. 14B except that individual clock inputs PB0, PC0 and PC1 are selectively switched or held at a logic level to provide the enable signals 1418, 1420 of FIGS. 14A–B.

Accordingly, in the period labeled 1510, data can be scanned into register 1402. In the period labeled 1512, the response of logic 1400 to data in register 1402 can be latched into register 1404. In the period labeled 1514 the test results can be scanned out of register 1404. Finally, in the period labeled 1516 the chip can return to normal operation.

While various embodiments of the present invention have been described above, it should be understood that they have been presented by way of example only, and not limitation. Thus, the breadth and scope of the present invention should not be limited by any of the above-described exemplary embodiments, but should be defined only in accordance with the following claims and their equivalents.

What is claimed is:

1. A clock splitter circuit comprising:

an event offset delay circuit;

a first event blocking filter having inputs coupled to a delayed output and an undelayed output of said event offset delay circuit, and a second event blocking filter having inputs coupled to an inverted delayed output signal and an inverted undelayed output signal of said event offset delay circuit wherein said first event blocking filter has an output coupled to an input of said first event blocking filter;

a first clock driver having an input coupled to the output of said first event blocking filter and a second clock driver having an input coupled to the output of said second event blocking filter; and wherein said second clock driver has another input coupled to an intermediate output signal and said first clock driver has another input coupled to an inverted intermediate output signal of said event offset delay circuit for synchronization.

2. The clock splitter circuit according to claim 1, wherein said event offset delay circuit comprises:

first, second, third, fourth and fifth inverters coupled in series;

wherein an input to said first inverter is the undelayed output signal and an output of said first inverter is the inverted undelayed output signal;

wherein an input of said third inverter is the intermediate output signal;

wherein an output of said third inverter is the inverted intermediate output signal;

wherein an output of said fourth inverter is the delayed output signal;

wherein an output of said fifth inverter is the inverted delayed output signal;

wherein the undelayed output signal and the delayed output signal are coupled to the input of said first event blocking filter; and wherein the inverted undelayed output signal and the inverted delayed output signal are coupled to the input of said second event blocking filter.

3. The clock splitter circuit according to claim 1, wherein said first event blocking filter comprises:

three series coupled PFETs;

a PFET coupled in parallel with a first and a second of said three series coupled PFETs; and four series coupled NFETs, a drain-source region of one of said four series coupled NFETs being coupled at a first in-phase output of said first event blocking filter to a drain-source region of a third of said series coupled PFETs, the source-drain region of said third one of said series coupled PFETs being a second in-phase output of said first event blocking filter.

4. The clock splitter circuit according to claim 3, wherein a first of said three series coupled PFETs is gated by the delayed output signal and a second of said three series coupled PFETs is gated by the undelayed output signal.

5. The clock splitter circuit according to claim 4, wherein a first of said four series coupled NFETs is gated by the undelayed output signal and a second of said four series coupled NFETs is gated to the delayed output signal, and said third NFET of said four series coupled NFETs is coupled to the output of said second event blocking filter.

6. The clock splitter circuit according to claim 4, wherein a gate of said third of said three series coupled PFETs is coupled to ground.

7. The clock splitter circuit according to claim 6, wherein said parallel coupled PFET is gated to an enable signal of said first event blocking filter.

8. The clock splitter circuit according to claim 7, wherein said fourth NFET of said four series coupled NFETs is gated to said enable signal.

9. The clock splitter circuit according to claim 7, wherein each of said first and said second clock drivers is an inverting clock driver and wherein said first clock driver comprises:

a first PFET having a source-drain region coupled to a supply voltage, and a gate of said first PFET gated by said first in-phase output of said first event blocking filter;

a second PFET having a source-drain region coupled to a drain-source region of said first PFET, and a gate of said second PFET gated by an inverted intermediate output signal; and an NFET having a source-drain region coupled to ground, a gate of said NFET gated by said second in-phase output of said first event blocking filter, and a drain-source region of said NFET coupled to a drain-source region of said second PFET and a drain-source region of said NFET at an output of said first clock driver.

10. A clock splitter circuit for providing an SEU tolerant pair of non-overlapping complementary clocks, said clock splitter circuit including a pair of cross-coupled clock buffers, each clock buffer comprising:

an event blocking filter of one of said pair of clock buffers receiving an undelayed clock signal and a delayed clock signal, said event blocking filter combining said undelayed clock signal with said delayed clock signal and an output of an event blocking filter of another of said pair of clock buffers, and providing at least one output;

at least one event offset delay circuit, each driven by an intermediate clock signal, to provide said clock phase output signal; and a clock driver being driven by the at least one output to provide a clock phase output signal;

wherein the event blocking filter of the other of said pair of clock buffers receives an inverted undelayed clock signal and an inverted delayed clock signal.

11. The clock splitter circuit according to claim 10, wherein said event offset delay circuit comprises a series of one or more inverters.

12. The clock splitter circuit according to claim 11, wherein at least one event offset delay circuit is one event offset delay circuit and said series of inverters includes a series of 5 inverters providing an undelayed complementary undelayed clock signal pair, a delayed complementary clock signal pair and an intermediate clock signal pair.

13. The clock splitter circuit according to claim 12, wherein said event blocking filter comprises:

three series coupled devices of a first conduction type;

four series coupled devices of a second conduction type, a conduction terminal of one of said three series coupled devices being coupled to a conduction terminal of said four series coupled devices; and a device of said first conduction type being coupled in parallel with two of said three series coupled devices.

14. The clock splitter circuit according to claim 13, wherein said event blocking filter provides a pair of in-phase clock outputs, one of the pair of in-phase outputs is at a coupling point of said parallel coupled device and another of the pair of in-phase outputs is at said coupling point of said three series coupled devices with said four series coupled devices.

15. The clock splitter circuit according to claim 14, wherein said devices of said first conduction type are P-type FETs and said devices of said second conduction type are N-type FETs, and the pair of in-phase outputs are separated by one of said three series coupled PFETs with a gate of said one of said three series coupled PFETs coupled to ground.

16. The clock splitter circuit according to claim 11, wherein said at least one event offset delay circuit is an event offset delay circuit in each said clock buffer, and wherein said event offset delay receives said undelayed clock signal and provides said delayed clock signal.

17. If The clock splitter circuit according to claim 16, wherein said event blocking filter comprises:

two series coupled first conduction type devices coupled between a supply line and an output terminal; and two series coupled second conduction type devices coupled between said output terminal and a reference voltage line.

18. The clock splitter circuit according to claim 17, wherein said first conduction type devices are P-type FETs and said second conduction type devices are N-type FETs.

19. A clock splitter circuit for providing an SEU tolerant pair of non-overlapping complementary clocks, the clock splitter circuit including a pair of cross-coupled clock buffers, each clock buffer comprising;

event blocking means, of a first of said pair of clock buffers for blocking single event effects in a received clock signal, for combining said received clock signal with a complementary received output of another event blocking means for combining of a second of said pair of clock buffers, and for providing at least one output; and driver means for driving a non-overlapped clock responsive to the ate least one output of said event blocking means; and an event off delay circuit for providing a delayed clock responsive to said received clock signal, wherein said driver means drives said clock further in response to a complementary intermediate clock signal.

* * * * *